(12) United States Patent
Tsuda

(10) Patent No.: US 8,477,483 B2
(45) Date of Patent: Jul. 2, 2013

(54) ELECTRONIC COMPONENT AND METHOD FOR MANUFACTURING ELECTRONIC COMPONENT

(75) Inventor: Motoji Tsuda, Hakusan (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 168 days.

(21) Appl. No.: 13/079,117

(22) Filed: Apr. 4, 2011

(65) Prior Publication Data

US 2011/0176264 A1 Jul. 21, 2011

Related U.S. Application Data

(63) Continuation of application No. PCT/JP2009/004171, filed on Aug. 27, 2009.

(30) Foreign Application Priority Data

Oct. 24, 2008 (JP) ................. 2008-274943

(51) Int. Cl.
*G06F 1/16* (2006.01)

(52) U.S. Cl.
USPC .............. 361/679.01; 360/99.08; 248/682; 257/676; 333/185

(58) Field of Classification Search
USPC ......... 360/245.1, 97.19, 97.16, 69, 99.08; 248/276.1, 205.1, 309.1, 224.8, 231.9, 544, 248/682, 118.5, 918, 551, 371, 125.1, 422; 361/679.01, 679.02, 679.31, 679.32, 679.33, 361/679.34, 679.36, 679.38, 679.39, 679.4, 361/679.46, 679.57, 679.58, 679.09, 679.23, 361/679.29, 679.41, 679.43, 679.45, 679.56; 439/66, 541.5, 260, 595; 257/620, 737, 532, 257/738, 676; 333/132, 512, 247, 131, 246, 333/185

See application file for complete search history.

(56) References Cited

U.S. PATENT DOCUMENTS

| | | | | |
|---|---|---|---|---|
| 2002/0055282 A1* | 5/2002 | Eldridge et al. | ............... | 439/66 |
| 2006/0192462 A1 | 8/2006 | Iwamoto et al. | | |
| 2009/0212399 A1 | 8/2009 | Kaneda et al. | | |
| 2011/0095418 A1* | 4/2011 | Lim et al. | ...................... | 257/737 |
| 2012/0126912 A1* | 5/2012 | Tsutsumi et al. | ............. | 333/132 |

FOREIGN PATENT DOCUMENTS

| | | |
|---|---|---|
| JP | 61-257008 A | 11/1986 |
| JP | 2007-028195 A | 2/2007 |
| JP | 2009-206183 A | 9/2009 |
| WO | 2006/006343 A1 | 1/2006 |

OTHER PUBLICATIONS

Official Communication issued in corresponding Japanese Patent Application No. 2010-502372, mailed on Apr. 10, 2012.
Official Communication issued in International Patent Application No. PCT/JP2009/004171, mailed on Oct. 6, 2009.

* cited by examiner

*Primary Examiner* — Hung Duong
(74) *Attorney, Agent, or Firm* — Keating & Bennett, LLP

(57) ABSTRACT

An electronic component and method for manufacturing thereof allow efficient separation of a mother substrate into electronic components defining individual devices. The method includes forming a conductive layer including electrodes and pads for a plurality of devices, an insulating layer that partially covers the conductive layer and that includes pad openings surrounding the pads and exposing at least central portions of the pads, and power supply lines that connect the pads of neighboring ones of the devices in the mother substrate. Power is applied to the power supply lines, and electrolytic plating is performed. Thus, plating layers are formed in the pad openings. Subsequently, external terminals are formed on the plating layers. By cutting the mother substrate, the mother substrate is separated into individual components defining electronic devices. Divided surfaces of the plurality of power supply lines are formed on each of the components so as to be separated from one another.

15 Claims, 26 Drawing Sheets

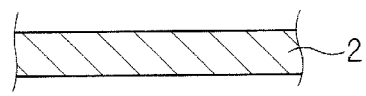
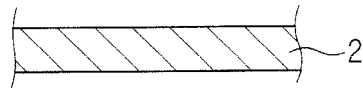
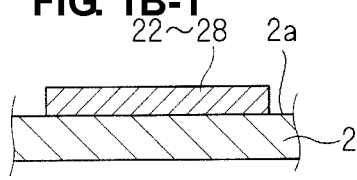
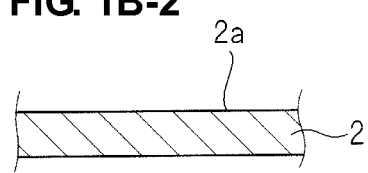
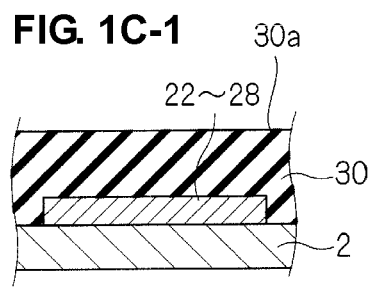
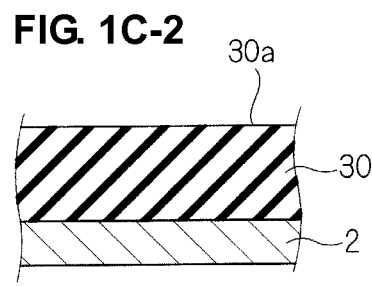
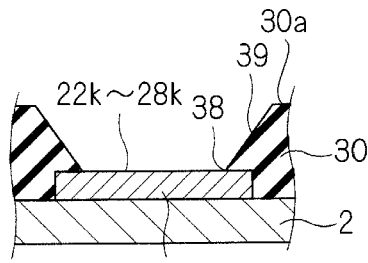
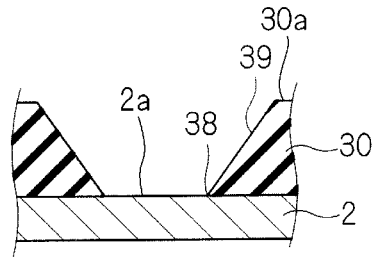
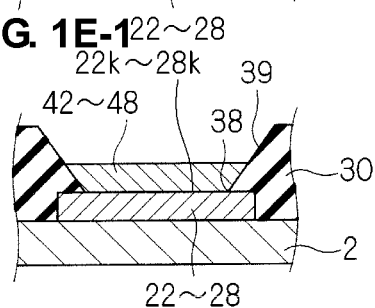
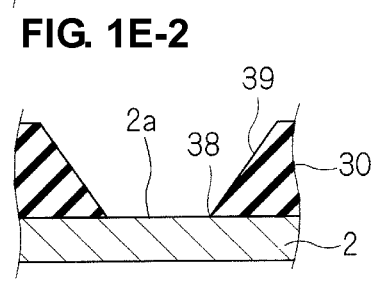
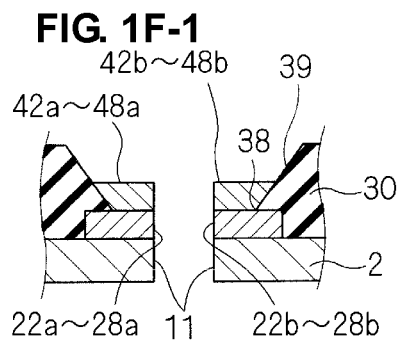
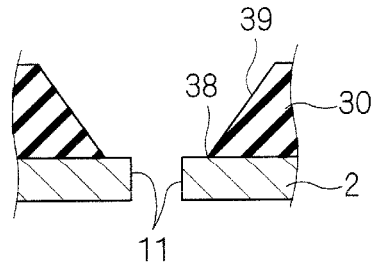

FIG. 24A
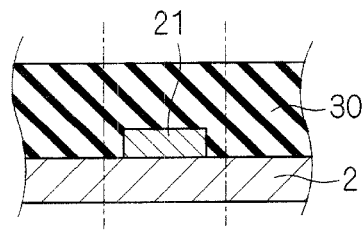
FIG. 24B
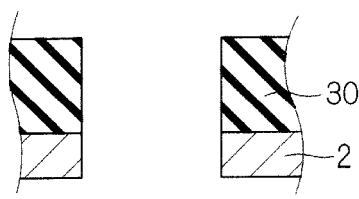
FIG. 25A
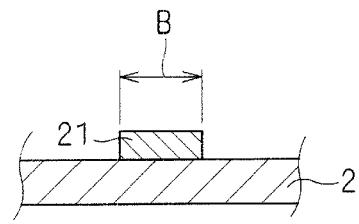
FIG. 25B
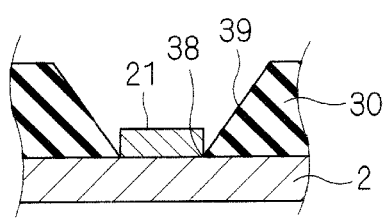
FIG. 25C-1
FIG. 25C-2
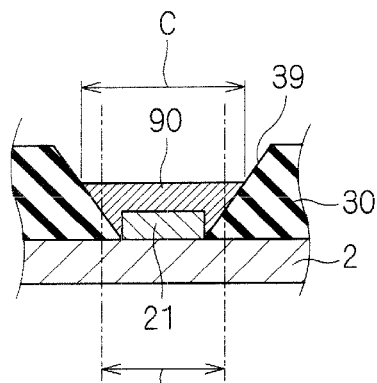
FIG. 25D-1
FIG. 25D-2
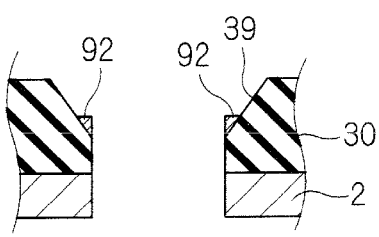
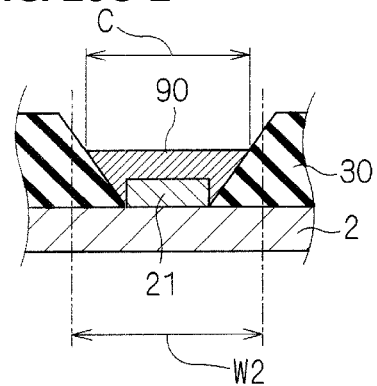
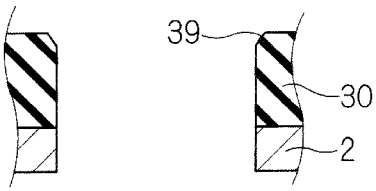

ELECTRONIC COMPONENT AND METHOD FOR MANUFACTURING ELECTRONIC COMPONENT

BACKGROUND OF THE INVENTION

1. Field of the Invention

The present invention relates to an electronic component and a method for manufacturing the electronic component and, in particular, to an electronic component including a portion in which a plating layer is disposed in a pad opening of an insulating layer located on a substrate and an external terminal is disposed on the plating layer, and a method for manufacturing the electronic component.

2. Description of the Related Art

In general, in order to manufacture an elastic wave device included in an elastic wave apparatus, a plurality of elastic wave devices are manufactured in the form of a mother substrate and, subsequently, the mother substrate is separated into separate components each defining an elastic wave device.

For example, FIG. 26A is a plan view schematically illustrating the manufacturing steps of a boundary elastic wave apparatus. FIG. 26B and FIGS. 27A to 27D are cross-sectional views taken along a line P-P of FIG. 26A and illustrate the manufacturing steps of the boundary elastic wave apparatus.

As shown in FIG. 27A, a comb-shaped IDT (interdigital transducer) electrode 9 that defines a boundary elastic wave device, which is one type of an elastic wave device, and an interconnection line 12 are formed on a piezoelectric substrate 1 using a first electrode layer. Thereafter, an insulating film 7 is formed on the first electrode layer. After an opening for exposing a portion of the interconnection line 12 (a bump) is formed in the insulating film 7, an under bump metal underlayer 13 and power supply lines 2 (not shown in FIGS. 27A-27D), 3, and connected to the under bump metal underlayer 13 are formed using a second electrode layer. As shown in FIG. 26A, the power supply lines 2, 3, and 14 include portions that are formed so as to surround the entire periphery of a component that defines a boundary elastic wave device in strip-shaped dicing areas 2A and 3A indicated by dotted lines. The dicing areas 2A and 3A are removed from the mother substrate in a dicing step performed later. Thus, the dicing areas 2A and 3A do not remain in the component defining a boundary elastic device.

Subsequently, as shown in FIG. 27B, a sound-absorbing film 8 is formed on the insulating film 7 using an insulating material. Thereafter, as shown in FIG. 27C, an opening 8a for exposing the under bump metal underlayer 13 is formed in the sound-absorbing film 8.

Thereafter, electrolytic plating is performed while power is being applied to the power supply lines 2, 3, and 14. Thus, as indicated by FIG. 27D, a plating layer 15 that serves as an under bump metal is formed on the under bump metal underlayer 13. Subsequently, as indicated by FIG. 26B, a metal bump 11a that serves as an external terminal is formed on the plating layer 15.

Subsequently, the dicing areas 2A and 3A are scraped off using a dicing blade so that the component defining a boundary elastic wave device is formed. Through such a dicing step, a side surface 6a of the component defining the boundary elastic wave device is formed (refer to, for example, Japanese Unexamined Patent Application Publication No. 2007-28195). However, when the power supply line is continuously formed in the dicing area so as to surround the entire periphery of a component defining an elastic wave device, the following problems arise.

If the power supply line that surrounds the entire periphery of a component defining an elastic wave device remains in the component after a dicing operation is performed, a short circuit in the device is caused. Thus, operational malfunction occurs. In order to prevent this problem, the power supply line that surrounds the entire periphery of a component defining an elastic wave device must be formed so as not to extend beyond the dicing area. That is, the width of the power supply line must be less than the width of the dicing area.

On the other hand, in an electrolytic plating process, plating is formed so as to be thicker towards a portion to which external electrical charge is supplied and thinner towards a direction away from the portion due to the electrical resistance of the power supply line. In order to reduce non-uniformity of the thickness of the plating or in order to increase the plating speed, the width of the power supply line must be increased. However, in such a case, the width of the dicing area must be increased to a value greater than or equal to the width of the power supply line in order to prevent a short circuit from occurring in the elastic wave device. If the width of the dicing area is increased, the number of components defining elastic wave devices obtained by separating a mother substrate having the same dimensions is decreased. Thus, the efficiency of the production is decreased.

As indicated by the cross-sectional view in FIG. 24A, if the insulating layer 30 that is formed on the piezoelectric substrate 2 is also formed on a power supply line 21 in the dicing area indicated by dotted lines in order to prevent formation of plating on the power supply line 21, the insulating layer 30 formed in the dicing area must be removed in the dicing step, as indicated by the cross-sectional view in FIG. 24B. Removal of the insulating layer reduces the life of the dicing blade, and the dicing speed cannot be increased.

As indicated by the cross-sectional view in FIG. 25A, the power supply line 21 having a width B and surrounding a component defining an elastic wave device is formed on the piezoelectric substrate 2. In addition, as indicated by the cross-sectional view in FIG. 25B, in order to expose the power supply line 21, the boundary opening 38 is formed in the insulating layer 30 formed on the piezoelectric substrate 2. Furthermore, a slope 39 is formed in the insulating layer 30 in the vicinity of the boundary opening 38. In such a case, as indicated by the cross-sectional views in FIGS. 25C-1 and 25C-2, a plating layer 90 to be formed on the power supply line 21 that is exposed through the boundary opening 38 in the insulating layer 30 is formed so as to expand along the slope 39 in the vicinity of the boundary opening 38 in the insulating layer 30. Thus, a width C of the plating layer 90 is greater than a width B of the power supply line 21 shown in FIG. 25A.

As shown in FIG. 25C-1, if a width W1 of the dicing area is less than the width C of the plating layer 90, a portion 92 of the plating layer 90 remains on the periphery of the component defining an elastic wave device even when the power supply line 21 in the dicing area is completely removed, as shown by the cross-sectional view in FIG. 25D-1. Thus, a short circuit in the elastic wave device occurs. If, as shown in FIG. 25C-2, if a width W2 of the dicing area is greater than the width C of the plating layer 90, the plating layer 90 can be completely removed by dicing, as shown in FIG. 25D-2.

As described above, in order to completely remove the plating layer 90, an area having a width greater than the width C of the plating layer 90 must be removed. Accordingly, it is difficult to increase the efficiency of production by increasing the number of components defining elastic wave devices obtained by separating a mother substrate having a constant size.

In addition, in recent years, one type of laser dicing method called "stealth dicing" has been used. In the stealth dicing method, a laser beam having a wavelength that passes through a dicing area is emitted and is focused on a point inside the substrate. In this way, a crack is generated inside the substrate. Thereafter, the substrate is expanded so that the substrate is separated. However, if the power supply line and the insulating layer are present in the dicing area and, therefore, the piezoelectric substrate is not exposed, a laser beam emitted from the outside does not reach the inside of the piezoelectric substrate. Consequently, the stealth dicing method cannot be applied.

SUMMARY OF THE INVENTION

Accordingly, preferred embodiments of the present invention provide an electronic component and a method for manufacturing the electronic component that enable efficient separation of a mother substrate into individual components defining elastic wave devices.

According to a preferred embodiment of the present invention, an electronic component that is formed by separating a mother substrate into a plurality of devices includes a conductive layer including an electrode and a plurality of pads, an insulating layer disposed on the surface of the mother substrate so as to cover a portion of the conductive layer and including pad openings surrounding the pads and exposing at least central portions of the pads, a plating layer disposed in each of the pad openings of the insulating layer by electrolytic plating, an external terminal disposed on the plating layer, and a plurality of power supply lines arranged to apply power to the pads exposed through the pad openings when the electrolytic plating is performed. In the mother substrate before being separated into the individual devices, at least one of the pads of one of the two neighboring devices is electrically connected to at least two pads of the other device via different power supply lines, and the different power supply lines are disposed so as to be separated from each other on a boundary between the two neighboring devices, and, in the component, the plurality of power supply lines are disposed along a divided surface that is formed when the devices are separated from the mother substrate so as to be separated from one another.

According to the above-described structure, in the mother substrate before being separated into the individual devices, power supply lines are disposed on a portion of a boundary between the neighboring devices. Accordingly, the area of power supply lines that are to be cut or removed along the boundary between the devices is reduced, as compared with the case in which a power supply line is disposed around the entire periphery of the devices. As a result, the efficiency of separating the mother substrate into individual components each defining a separate device can be increased.

In addition, when the mother substrate is separated into individual devices, the width of a dicing area that is removed along the boundary between the devices can be reduced regardless of the width of the power supply line. Accordingly, the number of devices produced from a wafer and having the same dimensions can be increased.

Furthermore, the width of the power supply line can be made larger than that of the dicing area. Accordingly, the amount of external electrical charge supplied to the power supply line during the electrolytic plating process can be increased and, therefore, the plating film can be efficiently formed.

Still furthermore, since a plurality of power supply lines are connected to one of the pads, the amount of external electrical charge supplied to the pad or the pad upper layer of the conductive layer can be increased and, therefore, plating formation can be facilitated. Thus, the thickness of the plating film can be made uniform, and the efficiency of the operation can be increased.

Preferably, in the mother substrate before being separated into the individual devices, the insulating layer has a boundary opening along a boundary between the neighboring devices, and a plating layer is disposed on the power supply lines exposed through the boundary opening by the electrolytic plating. The component includes the plating layer arranged along a divided surface formed when the devices are separated from the mother substrate.

In such a case, in the mother substrate before being separated into the devices, the insulating layer is not disposed on the boundary between the neighboring devices. Accordingly, when the mother substrate is separated, the insulating layer need not be cut. As a result, an operation for cutting the mother substrate into the individual components defining the devices can be efficiently performed.

In addition, the substrate and the power supply lines are preferably exposed through the boundary opening of the insulating layer along the boundary between the devices. Since the power supply lines are disposed on only a portion of the boundary between the devices, the substrate is exposed on most of the boundary between the devices. Accordingly, the mother substrate can be separated into individual components defining the individual devices preferably using a stealth dicing method in which a laser beam is emitted onto the substrate.

Preferably, the electronic component further includes a pad upper layer disposed between the plating layer and the pad in the pad opening. The power supply line is electrically connected to the pad via the pad upper layer.

In such a case, greater flexibility of selection of materials used for the layer structure including the conductive layer and the power supply lines can be provided.

In a preferred embodiment of the present invention, at least a portion of the power supply line is disposed on the mother substrate.

In another preferred embodiment of the present invention, at least a portion of the power supply line is disposed on the insulating layer.

Preferably, the insulating layer includes a first insulating layer and a second insulating layer, and at least a portion of the power supply line is disposed between the first insulating layer and the second insulating layer.

In such a case, greater flexibility of selection of materials used for the layer structure including the conductive layer and the power supply lines can be provided.

Preferably, in the mother substrate before being separated into the individual devices, an angle θ defined by the power supply line and a boundary between two neighboring devices is greater than or equal to about 20° and is less than or equal to about 90°, and an angle defined by the power supply line of the component and a divided surface formed when the devices are separated from the mother substrate is greater than or equal to about 20° and is less than or equal to about 90°, for example.

In such a case, the power supply lines do not interfere with a dicing operation, and do not cause a short circuit.

In a preferred embodiment of the present invention, the device preferably is a boundary elastic wave device.

In another preferred embodiment of the present invention, the device preferably is a surface acoustic wave device.

In addition, according to another preferred embodiment of the present invention, a method for manufacturing an electronic component having the following structure is provided.

The method for manufacturing an electronic component includes a first step of forming a mother substrate that includes a substrate, a conductive layer formed on the substrate, where the conductive layer includes electrodes and pads of a plurality of devices, an insulating layer being formed on the surface of the substrate so as to cover a portion of the conductive layer, where the insulating layer includes pad openings each surrounding one of the pads so as to expose at least a central portion of the pad, and a power supply line that connects the pads in the conductive layer, a second step of forming a plating layer in the pad opening of the insulating layer by electrolytic plating while applying power to the power supply line of the mother substrate and forming an external terminal on the plating layer, and a third step of cutting the mother substrate having the plating layer and the external terminal formed thereon and separating the mother substrate into individual components each defining a device. The power supply line of the mother substrate formed in the first step preferably perpendicularly, substantially perpendicularly, or diagonally crosses a boundary between the two neighboring devices and connects the pads in the conductive layers of the two neighboring devices, and the power supply line is preferably formed on only portions of the boundary that surround the device in which the power supply line crosses the boundary. In the component that defines a device and that is generated in the third step, divided surfaces of the plurality of power supply lines are formed so as to be separated from one another.

According to the above-described method, the power supply line is preferably formed on a portion of the boundary between the neighboring devices. Accordingly, as compared with the case in which the power supply line is formed on the entire boundary, the area of the power supply line that needs to be cut or removed along the boundary of the device in the third step is significantly reduced. As a result, the efficiency of the operation of separating the mother substrate into components defining the devices can be increased.

In addition, since the width of the dicing area that is removed along the boundary of the device in the third step can be reduced regardless of the width of the power supply line, the number of components defining individual devices formed from a wafer having the same dimensions can be increased.

Furthermore, since the width of the power supply line can be made larger than the width of the dicing area, the amount of external electrical charge supplied to the power supply line can be increased in the second step and, therefore, a plating film can be efficiently formed.

Preferably, in the first step, the insulating layer of the mother substrate includes a boundary opening formed so as to be separated from the boundary between the neighboring devices and along the boundary.

In such a case, the insulating layer is not formed on the boundary between the neighboring devices. Accordingly, the insulating layer need not be cut in the third step. Therefore, the operation of separating the mother substrate into components defining individual devices can be efficiently performed.

Furthermore, the substrate and the power supply line are exposed through the boundary opening of the insulating layer along the boundary between the devices. The power supply line is disposed on only a portion of the boundary between the devices, and the substrate is exposed on most of the boundary. Accordingly, the mother substrate can be separated into individual components defining the devices preferably using a stealth dicing method in which a laser beam is emitted onto the substrate, for example.

Preferably, the first step includes a first sub-step of forming the conductive layer on the surface of the substrate using a first electrode layer, a second sub-step of forming the power supply line on the surface of the substrate using a second electrode layer and forming a pad upper layer on the pad of the conductive layer, and a third sub-step of forming the insulating layer so that the pad upper layer is exposed through the pad opening of the insulating layer. In the second step, the plating layer is preferably formed on the pad upper layer.

In such a case, greater flexibility of selection of materials used for the layer structure including the conductive layer and the power supply lines can be provided.

Preferably, the first step includes a first sub-step of forming the conductive layer on the surface of the substrate using a first electrode layer, a second sub-step of forming, on the surface of the substrate, the insulating layer that partially covers the conductive layer, and a third sub-step of forming the power supply line using a third electrode layer and forming a pad upper layer on the pad of the conductive layer that is exposed through the pad opening of the insulating layer. In the second step, the plating layer is preferably formed on the pad upper layer.

In such a case, greater flexibility of selection of materials used for the layer structure including the conductive layer and the power supply lines can be provided.

Preferably, in the first step, the mother substrate is formed so that a plurality of the power supply lines are connected to one of the pads.

In such a case, the amount of external electrical charge supplied to the pad or the pad upper layer of the conductive layer can be increased in the second step and, therefore, plating formation can be facilitated. Thus, the thickness of the plating film can be made uniform, and the efficiency of the operation can be increased.

In a preferred embodiment of the present invention, the device preferably is a surface acoustic wave device.

In another preferred embodiment of the present invention, the device preferably is a boundary elastic wave device.

According to various preferred embodiments of the present invention, the number of components each defining a device acquired by separating a mother substrate having a constant size into the components can be increased. In addition, when the mother substrate is separated into components using a dicing blade, the life of the dicing blade can be increased, and the dicing speed can be increased. Furthermore, instead of using a dicing blade, a stealth dicing method can be used.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 1A-1 to 1F-2 are cross-sectional views of a main portion of an elastic wave apparatus illustrating manufacturing steps of the elastic wave apparatus according to a first preferred embodiment of the present invention.

FIG. 2 is a plan view of the elastic wave apparatus illustrating a manufacturing step of the elastic wave apparatus according to the first preferred embodiment of the present invention.

FIGS. 7A-1 to 7G-2 are cross-sectional views of a main portion of an elastic wave apparatus illustrating manufacturing steps of an elastic wave apparatus according to a second preferred embodiment of the present invention.

FIGS. 10A-1 to E-2 are cross-sectional views of a main portion of an elastic wave apparatus illustrating manufacturing steps of an elastic wave apparatus according to a third preferred embodiment of the present invention.

FIGS. 11F-1 to 11I-2 are cross-sectional views of a main portion of an elastic wave apparatus illustrating manufacturing steps of the elastic wave apparatus according to the third preferred embodiment of the present invention.

FIGS. 18A-1 to 18F-2 are cross-sectional views of a main portion of an elastic wave apparatus illustrating manufacturing steps of an elastic wave apparatus according to a fourth preferred embodiment of the present invention.

FIGS. 24A and 24B are cross-sectional views of a main portion of an elastic wave apparatus illustrating manufacturing steps of an elastic wave apparatus according to a comparative example.

FIGS. 25A to 25D-2 are cross-sectional views of a main portion of an elastic wave apparatus illustrating manufacturing steps of an elastic wave apparatus according to a comparative example.

DETAILED DESCRIPTION OF THE PREFERRED EMBODIMENTS

Preferred embodiments of the present invention are described with reference to FIGS. 1A-1 to 23.

First Preferred Embodiment

A method for manufacturing an elastic wave apparatus according to a first preferred embodiment of the present invention is described below with reference to FIGS. 1A-1 to 6. FIGS. 1A-1 to 1F-2 are cross-sectional views of a main portion of an elastic wave apparatus illustrating manufacturing steps of the elastic wave apparatus. Cross-sectional views of a main portion on the left side schematically illustrate a portion of a dicing area in which a power supply line is formed, whereas cross-sectional views of a main portion on the right side schematically illustrate a portion of the dicing area in which a power supply line is not formed. FIGS. 2 to 5 are plan views illustrating manufacturing steps of the elastic wave apparatus.

The elastic wave apparatus preferably includes an elastic wave device, such as a surface acoustic wave device or a boundary elastic wave device, for example. The elastic wave device is formed by producing a mother substrate including several elastic wave devices and, subsequently, separating the mother substrate into components defining individual elastic wave devices. The method for manufacturing an elastic wave apparatus is described below.

Figure 2:
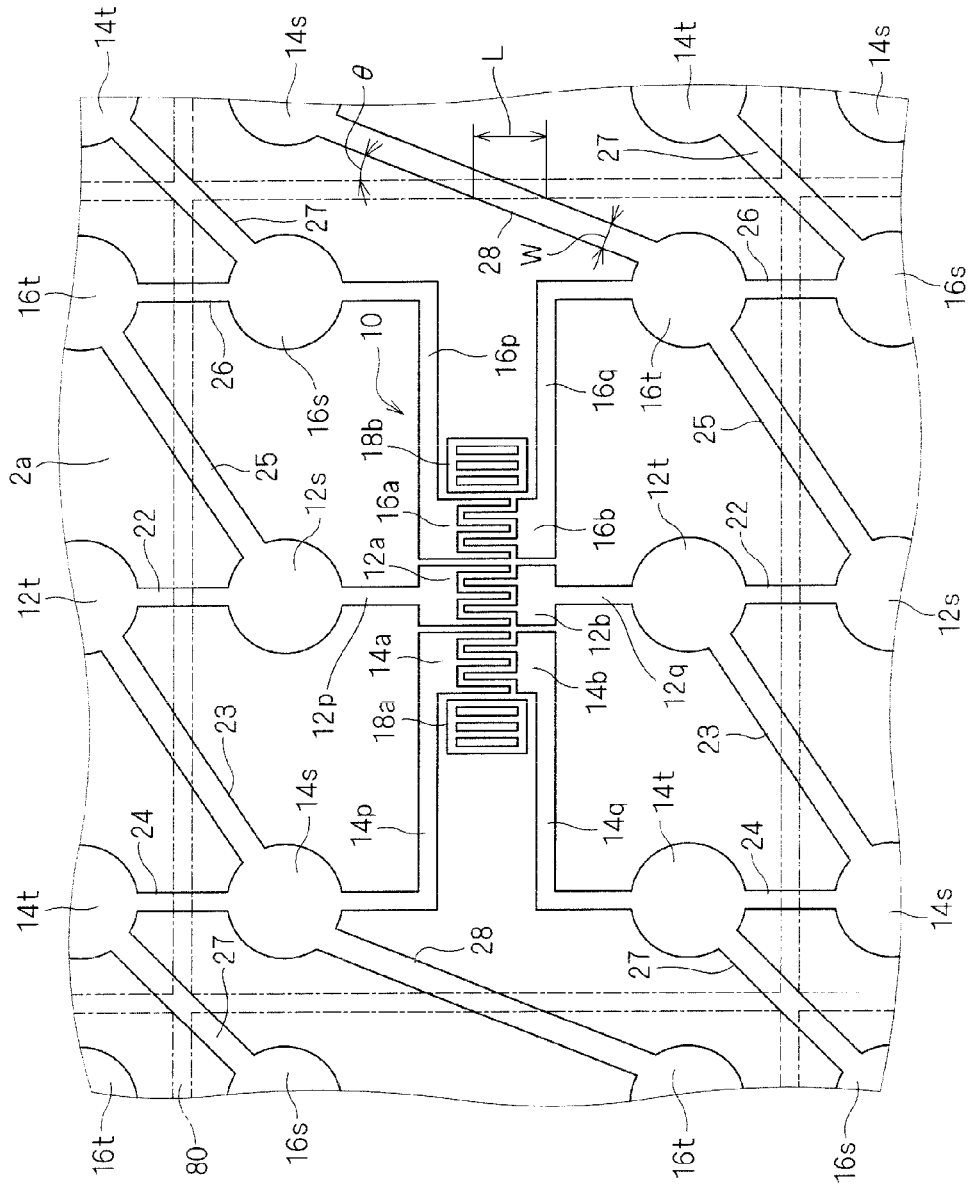
Figure 3:
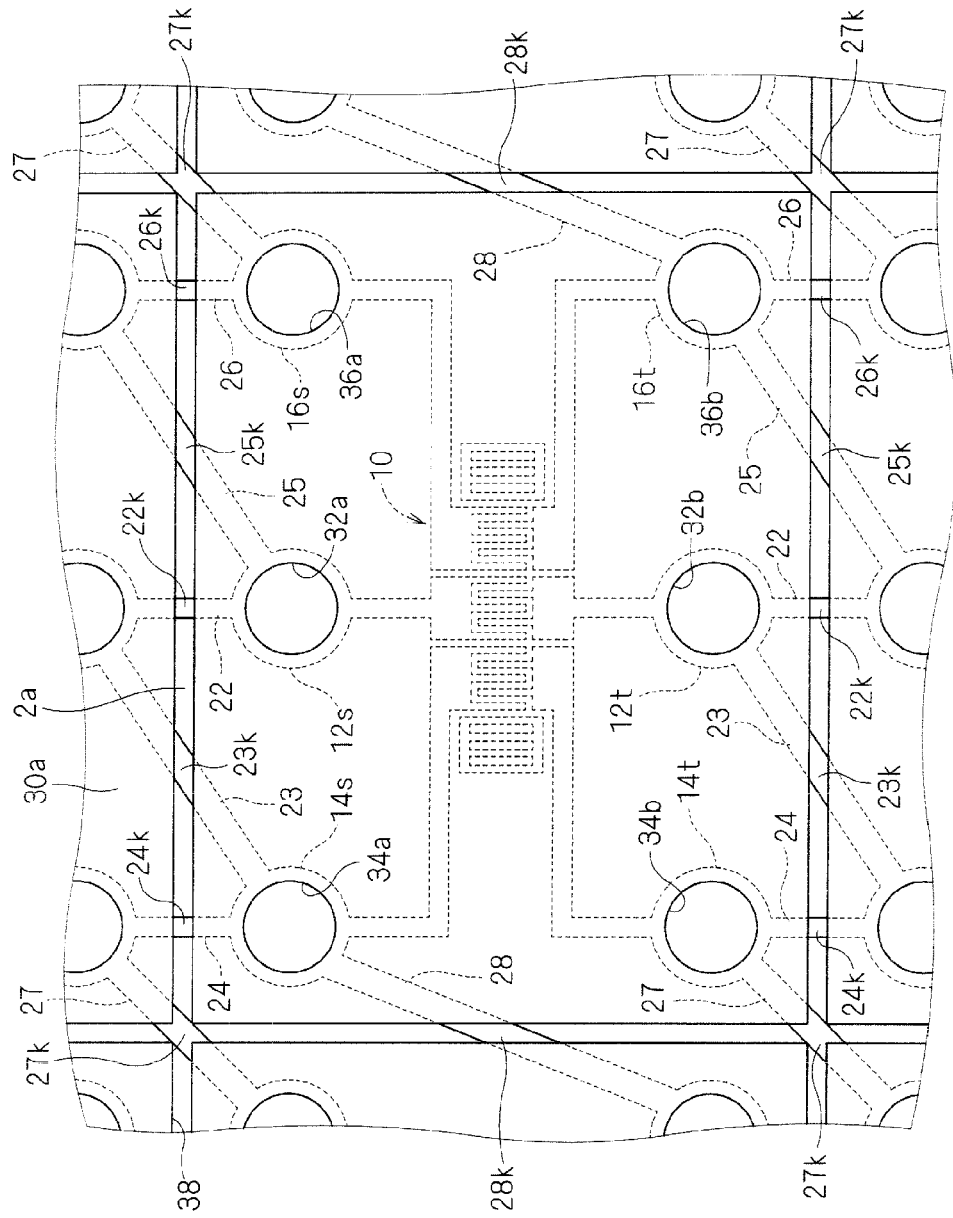
FIG. 3 is a plan view of the elastic wave apparatus illustrating a manufacturing step of the elastic wave apparatus according to the first preferred embodiment of the present invention.
Figures 1, 7A:
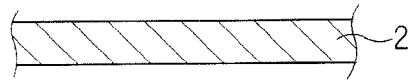
Figures 2, 7A:
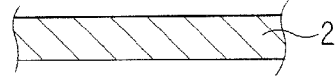
Figures 1, 7B:
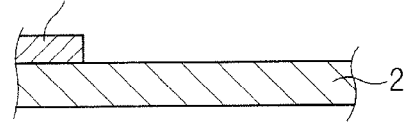
Figures 2, 7B:
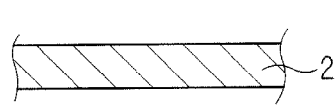
Figures 1, 7C:
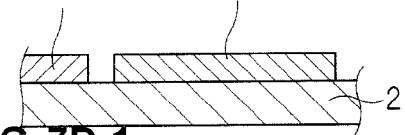
Figures 2, 7C:
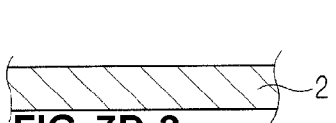

First, as shown in FIGS. 1A-1 and 1A-2, a piezoelectric substrate 2 preferably made of lithium niobate, for example, is prepared. According to the present preferred embodiment, lithium niobate, for example, is preferably used. However, another piezoelectric material, such as potassium niobate, lithium tantalite, lithium tetraborate, langasite, langanite, quartz, PZT, or ZnO, may be used, for example.

Subsequently, as shown in FIGS. 1B-1 and 1B-2 and FIG. 2, a conductive layer 10 and power supply lines 22 to 28 preferably made of Au, for example, are formed on a surface 2a of the piezoelectric substrate 2. As shown in FIG. 2, in the piezoelectric substrate 2, portions each defining a component that is to serve as an elastic wave device are adjacent to each other via a dicing area 80.

For example, an electrode layer is preferably formed on the surface 2a of the piezoelectric substrate 2 using, for example, a vapor deposition method or a sputtering method. Subsequently, a photoresist is applied, exposed, and developed. Thus, a mask pattern is formed. Thereafter, dry etching or wet etching is conducted through the mask pattern. Thus, the electrode layer is etched, and the conductive layer 10 and the power supply lines 22 to 28 are formed. Thereafter, the mask pattern is removed. Alternatively, a photoresist is applied onto the surface 2a of the piezoelectric substrate 2, is exposed, and is developed, for example. Thus, a mask pattern is formed. Thereafter, an electrode layer is formed via the mask pattern preferably by using, for example, a vapor deposition method or a sputtering method. Subsequently, the mask pattern and the electrode layer formed on the mask pattern are removed. Thus, the conductive layer 10 and the power supply lines 22 to 28 are formed. According to the present preferred embodiment, Au is preferably used for the electrode layer, for example. However, the following metal or an alloy thereof may be used in place of Au: Al, Ti, Ni, Cr, Cu, Au, Ag, Pt, Mg, W, Zn, Mn, Pd, Co, or Sn, for example. Alternatively, by laminating at least two of these metals, an electrode layer may be formed.

The conductive layer 10 is formed for each of the portions which are components defining elastic wave devices surrounded by the dicing area 80. For each of the portions which are components that are to define elastic wave devices, the conductive layer 10 preferably includes three pairs of finger electrodes 12a and 12b; finger electrodes 14a and 14b; and finger electrodes 16a and 16b, reflectors 18a and 18b, pads 12s and 12t, pads 14s and 14t, pads 16s and 16t, connection units 12p and 12q that connect the finger electrodes 12a and 12b to the pads 12s and 12t, respectively, connection units 14p and 14q that connect the finger electrodes 14a and 14b to the pads 14s and 14t, respectively, and connection units 16p, 16q that connect the finger electrodes 16a and 16b to the pads 16s and 16t, respectively. An IDT electrode is defined by a pair of finger electrodes so that the fingers of the finger electrodes are interdigitated.

The power supply lines 22 to 28 extend across the dicing area 80 so as to connect the pad 12s of one of the components defining an elastic wave device to the pad 12t of a component that neighbors the component with the dicing area 80 therebetween, the pad 12t of one of the components serving as an elastic wave device to the pad 14s of the neighboring component, the pad 14s of one of the components defining an elastic wave device to the pad 14t of the neighboring component, the pad 12s of one of the components defining an elastic wave device to the pad 16t of the neighboring component, the pad 14t of one of the components defining an elastic wave device to the pad 16s of the neighboring component, and the pad 14s of one of the components defining an elastic wave device to the pad 16t of the neighboring component, respectively.

A plurality of individual ones of the power supply lines 22 to 28 are preferably connected to each of the pads 12s, 12t, 14s, 14t, 16s, and 16t. In this way, during a plating step described below, external electrical charge supplied to the pads 12s, 12t, 14s, 14t, 16s, and 16t can be increased and, therefore, formation of plating can be facilitated. Accordingly, the operation efficiency can be increased.

Subsequently, as shown in FIGS. 1C-1 and 1C-2, an insulating layer 30 preferably made of $SiO_2$, for example, is formed on the surface 2a of the piezoelectric substrate 2, which has the conductive layer 10 and the power supply lines 22 to 28 formed thereon, by a sputtering method or an applying method so as to cover the entire or substantially the entire surface 2a. According to the present preferred embodiment, $SiO_2$ is preferably used for the insulating layer 30. However, Si, glass, SiC, SiN, TiO, TiN, $Ta_2O_5$, AlN, $Al_2O_3$, $C_3N_4$, polyimide, or an epoxy-based resin, for example, may be used in place of $SiO_2$.

Subsequently, as shown in FIGS. 1D-1 and 1D-2 and FIG. 3, a portion of the insulating layer 30 is removed so that pad openings 32a, 32b, 34a, 34b, 36a, and 36b and a boundary opening 38 are formed. The pad openings 32a, 32b, 34a, 34b, 36a, and 36b are formed in order to expose the central portions of the pads 12s, 12t, 14s, 14t, 16s, and 16t of the conductive layer 10, respectively. The boundary opening 38 is formed in order to expose the surface 2a of the piezoelectric substrate 2 in the dicing area 80 or portions 22k to 28k of the power supply lines 22 to 28, respectively.

For example, a photoresist is preferably applied onto the insulating layer 30. Thereafter, the photoresist is exposed to light and is developed. Thus, a mask pattern is formed. After the pad openings 32a, 32b, 34a, 34b, 36a, and 36b and the boundary opening 38 are formed in the insulating layer 30 using a dry etching method or a wet etching method, the mask pattern is removed. In the etching step, when, for example, ICP-RIE (Inductive Coupled Plasma-Reactive Ion Etching) using $CF_4$ is conducted, the insulating layer 30 is formed so as to have a tapered shape in cross section in the vicinity of the pad openings and the boundary opening 38, as shown in FIG. 1D-1 and 1D-2. Thus, slopes 39 are formed between each of the pad openings and an upper surface 30a of the insulating layer 30 and between the boundary opening 38 and the upper surface 30a. It should be noted that an etching method is not limited to ICP-RIE using $CF_4$. For example, a dry etching method or a wet etching method may preferably be used.

Subsequently, as shown in FIGS. 1E-1 and 1E-2 and FIG. 4, power is applied to the power supply lines 22 to 28. While external electrical charge is being supplied to the pads 12s, 12t, 14s, 14t, 16s, and 16t, electrolytic plating is performed. Thus, plating layers 42s, 42t, 44s, 44t, 46s, and 46t that are preferably made of Ni, for example, and that define a bump metal are formed on the pads 12s, 12t, 14s, 14t, 16s, and 16t exposed through the pad openings 32a, 32b, 34a, 34b, 36a, and 36b, respectively. At the same time, plating layers 42 to 48 are formed on the portions 22k to 28k of the power supply lines 22 to 28 exposed through the boundary opening 38, respectively.

Figure 4:
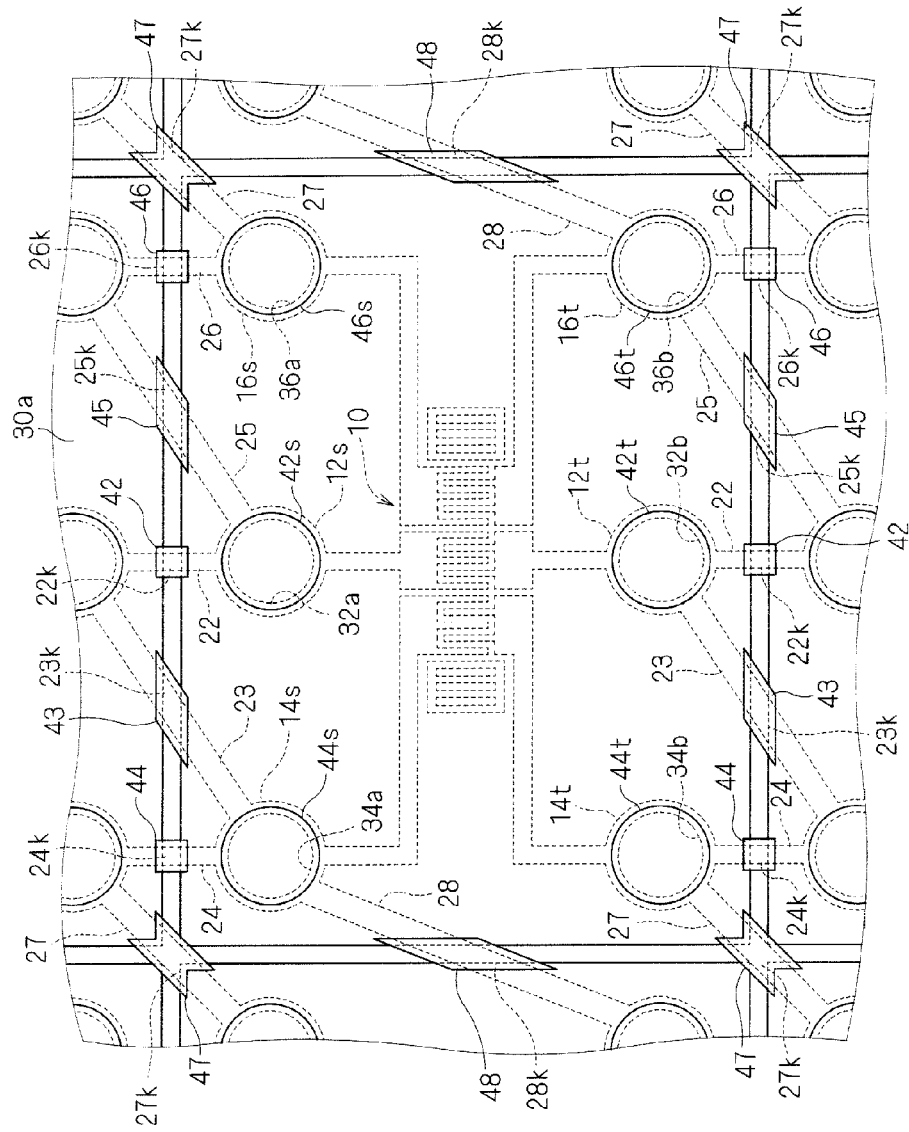
FIG. 4 is a plan view of the elastic wave apparatus illustrating a manufacturing step of the elastic wave apparatus according to the first preferred embodiment of the present invention.

As shown in FIGS. 1E-1 and 1E-2, the plating layers 42s, 42t, 44s, 44t, 46s, and 46t and the plating layers 42 to 48 are also preferably formed on the slopes 39 that continuously extend from the pad openings 32a, 32b, 34a, 34b, 36a, and 36b of the insulating layer 30 and the boundary opening 38. In addition, as shown in FIG. 4, the plating layers 42s, 42t, 44s, 44t, 46s, and 46t and the plating layers 42 to 48 preferably extend outside the pad openings 32a, 32b, 34a, 34b, 36a, and 36b of the insulating layer 30 and the boundary opening 38. It should be noted that while, according to the present preferred embodiment, the plating layer is preferably formed by electrolytic plating using Ni, the plating layer may be formed using a metal such as Au, Sn, Zn, Pt, Cu, Cr, or Pd, for example, instead of Ni.

Subsequently, external terminals 49 (shown in FIG. 5 described below) are formed on the plating layers 42s, 42t, 44s, 44t, 46s, and 46t formed in the pad openings 32a, 32b, 34a, 34b, 36a, and 36b of the insulating layer 30. For example, the external terminals 49 are preferably metal bumps, such as solder bumps.

Subsequently, as shown in FIGS. 1F-1 and 1F-2 and FIG. 5, the mother substrate is cut and separated into individual components each defining an elastic wave device. For example, the piezoelectric substrate 2, the power supply lines 22 to 28, and the plating layers 42 to 48 present in the dicing area are preferably cut by using a dicing blade and are removed. Alternatively, by emitting a laser beam onto the dicing area, the piezoelectric substrate is reformed along the boundary. Thereafter, the mother substrate is cut and separated into components each defining an elastic wave device.

As shown in FIG. 1F-1, on a side surface 11 of the component separated from the mother substrate, cutting planes 22a to 28a and cutting planes 22b to 28b of the power supply lines 22 to 28 are formed so as to cut across the dicing area. Thus, the cutting planes 22a to 28a and cutting planes 22b to 28b are formed so as to be separated from each other, respectively.

As shown in FIG. 2, θ denotes the angle formed by the power supply line 28 having a width of W and the dicing area 80. Then, a length L of a portion of the power supply line appearing on the side surface of the component defining an elastic wave device, which is separated from the mother substrate, is expressed as: L=W/sin θ. When the power supply line 28 diagonally crosses the dicing area 80, sin θ<1. Accordingly, L>W. In particular, when θ<20°, L is greater than three times W. Thus, the ratio of occupation of the power supply lines 22 to and the plating layers 42 to 48 to the dicing area 80 is increased. Therefore, in order to facilitate a dicing operation and to prevent short circuiting, it is desirable that θ be greater than or equal to about 20°, for example.

Figure 5:
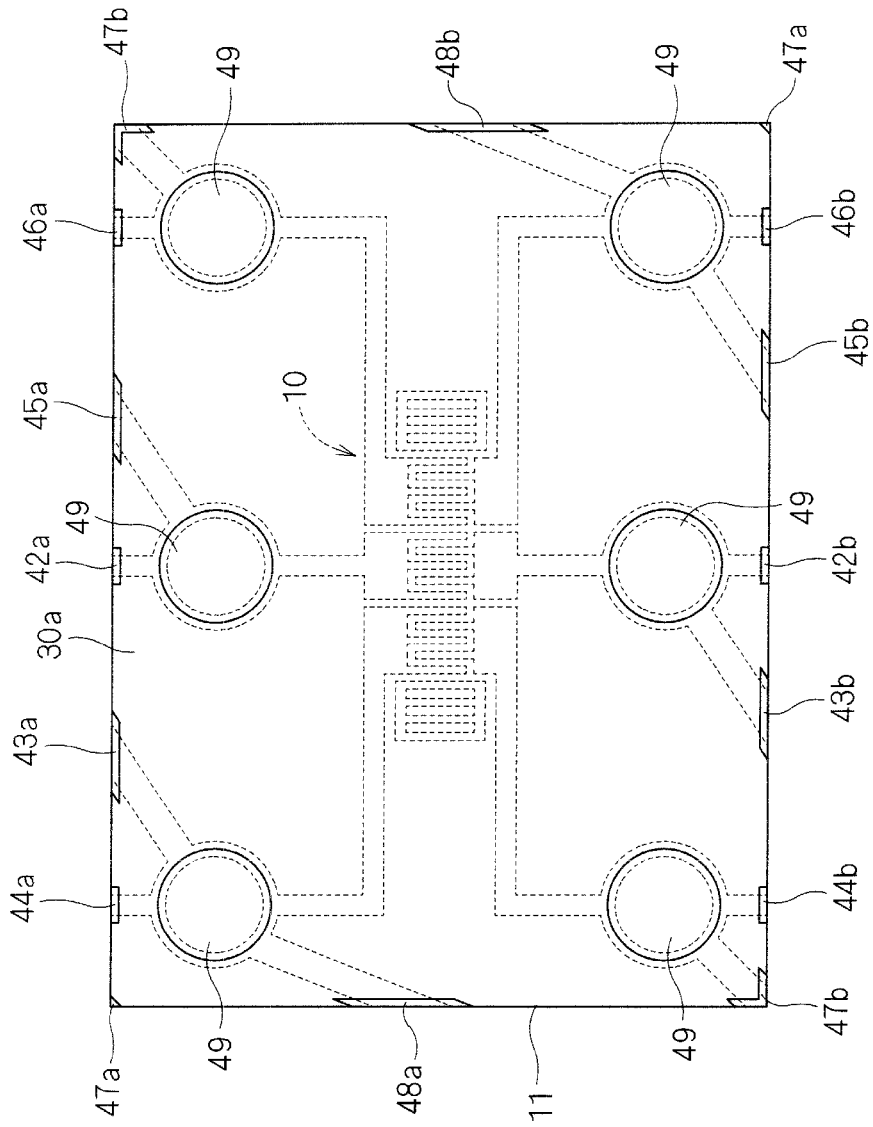
FIG. 5 is a plan view of the elastic wave apparatus illustrating a manufacturing step of the elastic wave apparatus according to the first preferred embodiment of the present invention.
Figure 6:
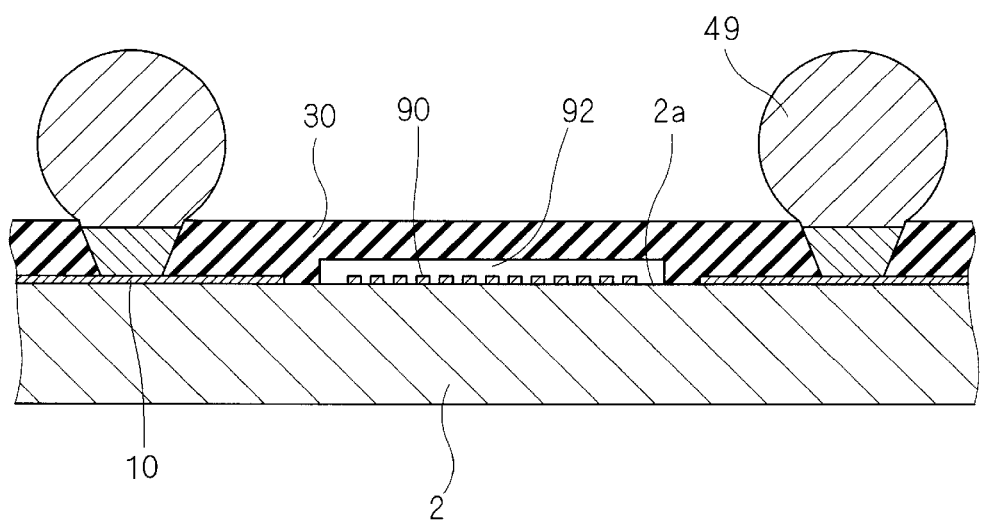
FIG. 6 is a cross-sectional view of the elastic wave apparatus according to the first preferred embodiment of the present invention.

As shown in FIG. 1F-1, if portions 42a to 48a and portions 42b to 48b of the plating layers 42 to 48 formed on the power supply lines 22 to 28 remain after a dicing operation is performed, the remaining portions 42a to 48a and portions 42b to 48b are exposed along the side surface 11 of a component defining an elastic wave device, as shown in FIG. 5.

A separated component defining an elastic wave device is preferably mounted on a mounting substrate via the external terminal 49. Thereafter, the elastic wave device is preferably shielded with, for example, a resin, as desired. Thus, an elastic wave apparatus is achieved. Note that if the elastic wave device is a boundary elastic wave device, an IDT electrode can be shielded using the piezoelectric substrate 2 and the insulating layer 30, since boundary elastic waves propagate in a boundary surface between the piezoelectric substrate 2 and the insulating layer 30. Accordingly, the elastic wave device need not be shielded with a mounting surface or a resin. Thus, an elastic wave apparatus can be provided by using only the boundary elastic wave device. In addition, even when the elastic wave device is a surface acoustic wave device, an elastic wave apparatus can be provided by using only the surface acoustic wave device by, as shown by the cross-sectional view of FIG. 6, providing a space 92 between the insulating layer 30 and an IDT electrode 90 and sufficiently increasing the thickness of the insulating layer 30.

In the above-described manufacturing method according to the first preferred embodiment of the present invention, a boundary opening is formed in the insulating layer, and dicing is performed along the boundary opening. Accordingly, in the dicing step for separating a mother substrate into components, that each define an elastic wave device, it is not necessary to cut the insulating layer and remove the insulating layer. Therefore, when a dicing step is performed using a blade, the dicing speed can be increased. In addition, the life of blade can be increased.

In addition, an insulating layer is not present in the dicing area. Furthermore, a power supply line and a plating layer are present in only a portion of the dicing area. Since the piezoelectric substrate is exposed in most of the dicing area, the mother substrate can be separated into components each defining an elastic wave device using a stealth dicing technique.

Since the plating layers are formed on the power supply lines in the dicing area so as to be separated for each of the power supply lines that cross the dicing area, a short circuit between the pads does not occur even when the component defining an elastic wave device remains after a dicing operation is performed.

Since it is not necessary that the plating layer and the power supply line be completely removed, the width of the dicing area can be reduced when a dicing operation using a blade is used. Thus, a blade having a large width is not required. Therefore, the ratio of occupation of the components defining elastic wave devices to the area of the mother substrate can be increased.

Second Preferred Embodiment

Figure 8:
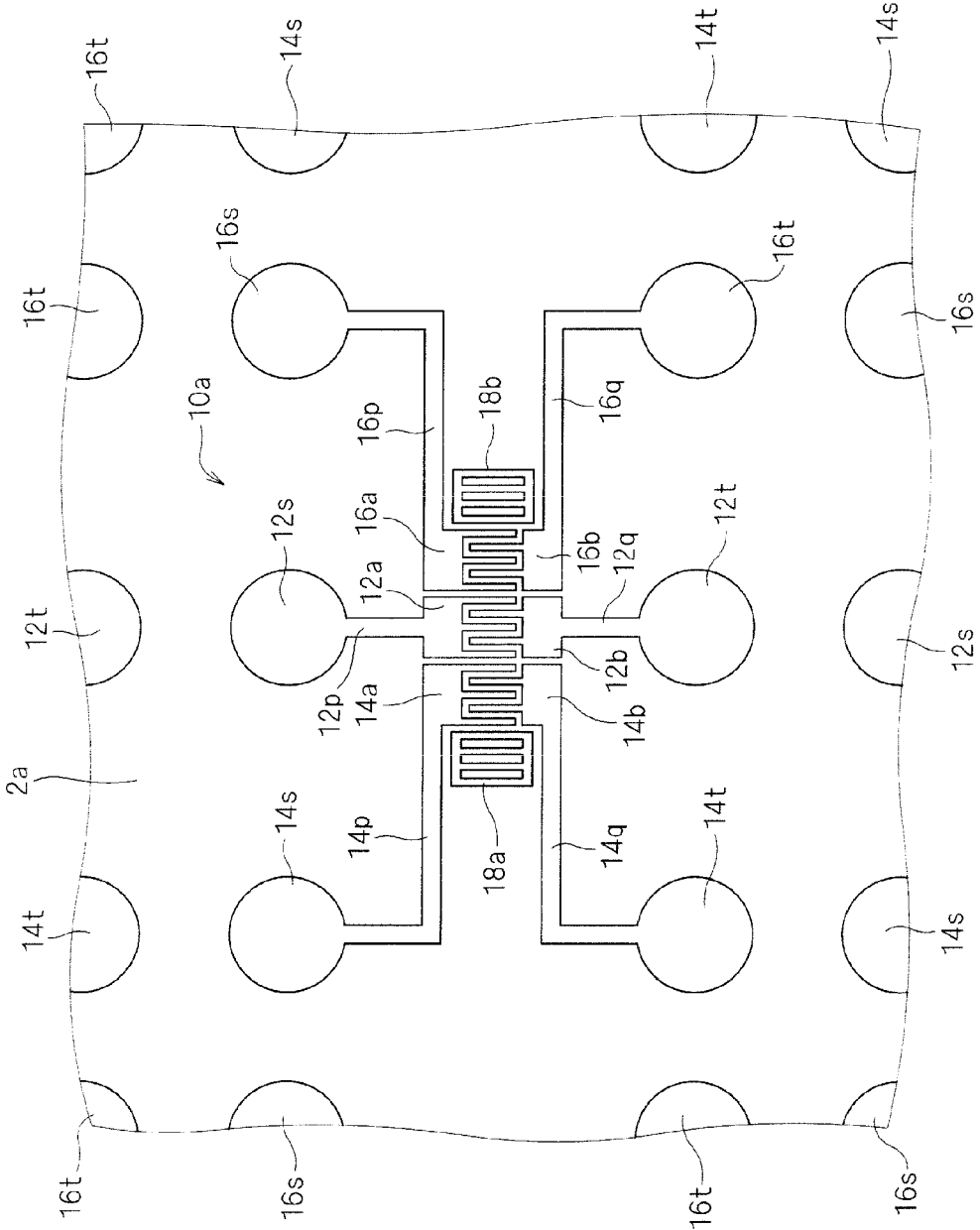
FIG. 8 is a plan view of the elastic wave apparatus illustrating a manufacturing step of the elastic wave apparatus according to the second preferred embodiment of the present invention.
Figure 9:
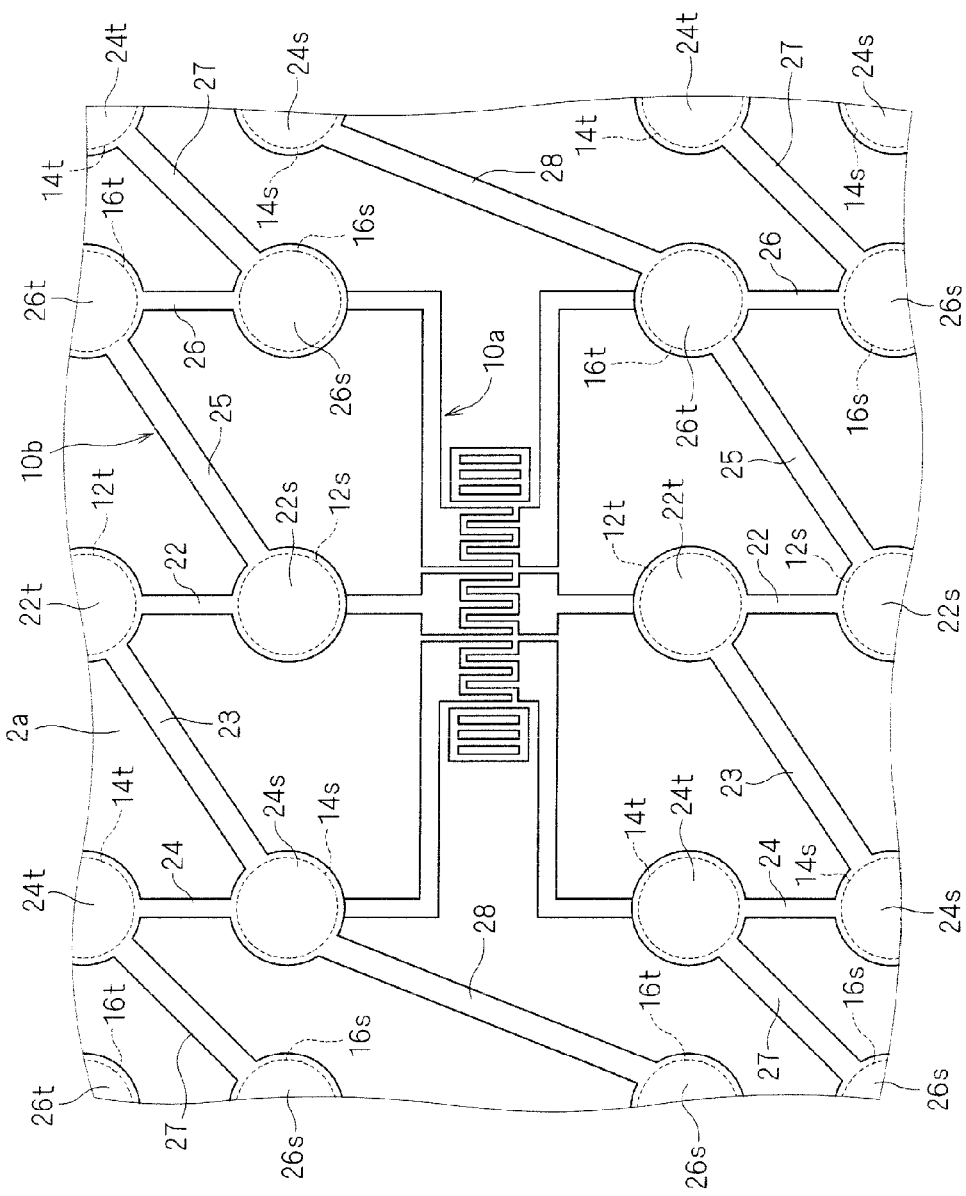
FIG. 9 is a plan view of the elastic wave apparatus illustrating a manufacturing step of the elastic wave apparatus according to the second preferred embodiment of the present invention.

A method for manufacturing an elastic wave device according to a second preferred embodiment of the present invention is described below with reference to FIGS. 7A-1 to 9. FIGS. 7A-1 to 7C-2 are cross-sectional views of a main portion of an elastic wave apparatus illustrating steps of manufacturing the elastic wave apparatus. Cross-sectional views of a main portion on the left side schematically illustrate a portion of a dicing area in which a power supply line is formed, whereas cross-sectional views of a main portion on the right side schematically illustrate a portion of the dicing area in which a power supply line is not formed. FIGS. 8 and 9 are plan views illustrating manufacturing steps of the elastic wave apparatus.

The method for manufacturing an elastic wave apparatus according to a second preferred embodiment preferably is similar to the method for manufacturing an elastic wave apparatus according to the first preferred embodiment except that a conductive layer is formed separately from a power supply line. In the following description, the same numbering will be used in describing the method for manufacturing an elastic wave apparatus according to a second preferred embodiment as was utilized in describing the method for manufacturing the elastic wave apparatus according to the first preferred embodiment, and the differences are mainly described below.

First, as shown in FIGS. 7A-1 and 7A-2, a piezoelectric substrate 2 is prepared. Subsequently, as shown in FIGS. 7B-1 and 7B-2 and FIG. 8, a conductive layer 10a is preferably formed on a surface 2a of the piezoelectric substrate 2. For example, a first electrode layer is formed on the surface 2a of the piezoelectric substrate 2 using, for example, a vapor deposition method or a sputtering method. Subsequently, a photoresist is applied, exposed, and developed. Thus, a mask pattern is formed. Thereafter, dry etching or wet etching is conducted through the mask pattern. Thus, the first electrode layer is etched, and a conductive layer 10a is formed. Thereafter, the mask pattern is removed.

As shown in FIG. 8, the conductive layer 10a preferably includes three pairs of IDT electrodes 12a and 12b; IDT electrodes 14a and 14b; and IDT electrodes 16a and 16b, reflectors 18a and 18b, pads 12s and 12t, pads 14s and 14t, pads 16s and 16t, connection units 12p and 12q that connect the finger electrodes 12a and 12b to the pads 12s and pad 12t, respectively, connection units 14p and 14q that connect the finger electrodes 14a and 14b to the pads 14s and 14t, respectively, and connection units 16p, and 16q that connect the finger electrodes 16a and 16b to the pads 16s and 16t, respectively.

Subsequently, as shown in FIGS. 7C-1 and 7C-2 and FIG. 9, a second electrode layer 10b is preferably formed on the surface 2a of the piezoelectric substrate 2. For example, the second electrode layer is formed on the surface 2a of the piezoelectric substrate 2 by a vapor deposition method or a sputtering method. Thereafter, a photoresist is applied, exposed, and developed. Thus, a mask pattern is formed. Thereafter, dry etching or wet etching is conducted through the mask pattern. Thus, the second electrode layer 10b is formed. Subsequently, the mask pattern is removed.

As shown in FIG. 9, the second electrode layer 10b preferably includes pad upper layers 22s, 22t, 24s, 24t, 26s, and 26t formed on pads 12s, 12t, 14s, 14t, 16s, and 16t of the conductive layer 10a, respectively, and the power supply lines 22 to 28 that connect the pad 12s to the pad 12t in each of the portions serving as components each defining an elastic wave device, the pad 12t to the pad 14s, the pad 14s to the pad 14t, the pad 12s to the pad 16t, the pad 14t to the pad 16s, and the pad 14s to the pad 16t.

Figures 1, 7D:
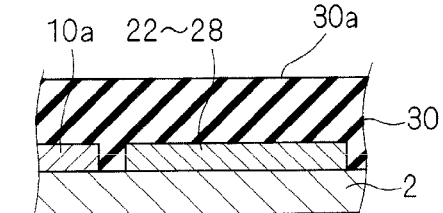
Figures 2, 7D:
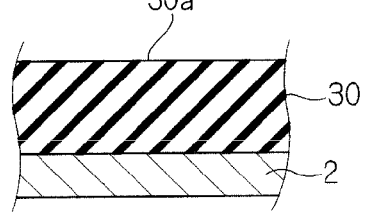

Subsequently, as shown in FIGS. 7D-1 and 7D-2, an insulating layer 30 is preferably formed on the surface 2a of the piezoelectric substrate 2 by a sputtering method or an applying method, for example, so as to cover the entire or substantially the entire surface 2a.

Figures 1, 7E:
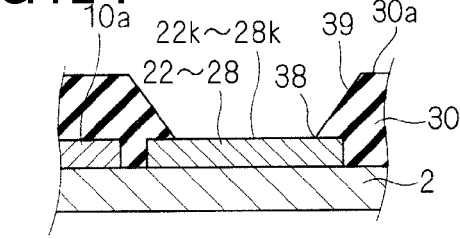
Figures 2, 7E:
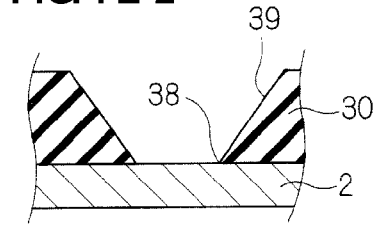

Subsequently, as shown in FIGS. 7E-1 and 7E-2, a portion of the insulating layer 30 is removed so that pad openings and a boundary opening 38 are formed. The pad openings are formed in order to expose the pad upper layers 22s, 22t, 24s, 24t, 26s, and 26t. The boundary opening 38 is formed in order to expose the surface 2a of the piezoelectric substrate 2 in a dicing area or portions 22k to 28k of the power supply lines 22 to 28, respectively. For example, a photoresist is applied onto the insulating layer 30. Thereafter, the photoresist is exposed to light and is developed. Thus, a mask pattern is formed. After the pad openings and the boundary opening 38 are formed in the insulating layer 30 using a dry etching method or a wet etching method, the mask pattern is removed.

Figures 1, 7F:
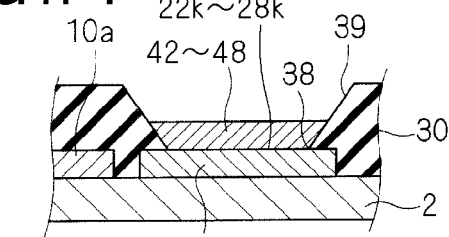
Figures 2, 7F:
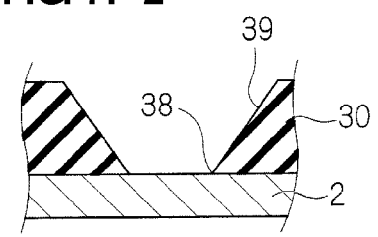

Subsequently, power is preferably applied to the power supply lines 22 to 28. While external electrical charge is being supplied, electrolytic plating is conducted. Thus, plating layers that define an under bump metal are formed on the pad upper layers exposed through the pad openings. At the same time, as shown in FIGS. 7F-1 and 7F-2, plating layers 42 to 48 are also formed on the portions 22k to 28k of the power supply lines to 28 exposed through the boundary opening 38 of the insulating layer 30, respectively.

Subsequently, external terminals (metal bumps) are preferably formed on the plating layers formed in the pad openings of the insulating layer.

Figures 1, 7G:
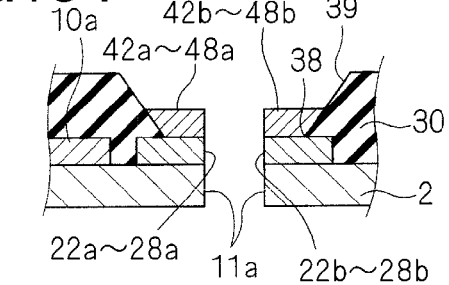
Figures 2, 7G:
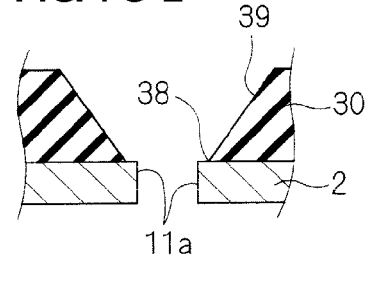

Subsequently, as shown in FIGS. 7G-1 and 7G-2, the mother substrate is preferably cut and separated into components each defining an elastic wave device preferably by using a dicing blade or a stealth dicing technique in which a laser beam is emitted, for example.

A separated component defining an elastic wave device is preferably mounted on a mounting substrate via the external terminal. Thereafter, the elastic wave device is preferably shielded with, for example, a resin as desired. Thus, an elastic wave apparatus is provided.

In the above-described manufacturing method according to the second preferred embodiment, operations and advantages that are the same as those achieved by the first preferred embodiment are provided.

Furthermore, in the manufacturing method according to the second preferred embodiment, the plating layer is preferably formed on the second electrode layer. Accordingly, a metal to which a plating layer strongly adheres can be used as a top portion of the second electrode layer. While the present preferred embodiment has been described with reference to Pt, for example, as a preferable material of the top portion of the second electrode layer, Cu may be used, for example. Alternatively, Al, Sn, Pd, or Au may be used, for example. In contrast, the first electrode layer that defines element portions, such as an IDT, need not have easy connectivity with a plating layer. Accordingly, the flexibility of selection of materials used for the layer structure of the conductive layer can be increased.

Third Preferred Embodiment

Figures 1, 10A:
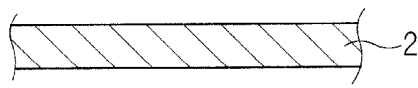
Figures 2, 10A:
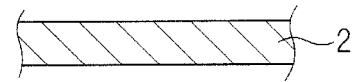
Figure 17:
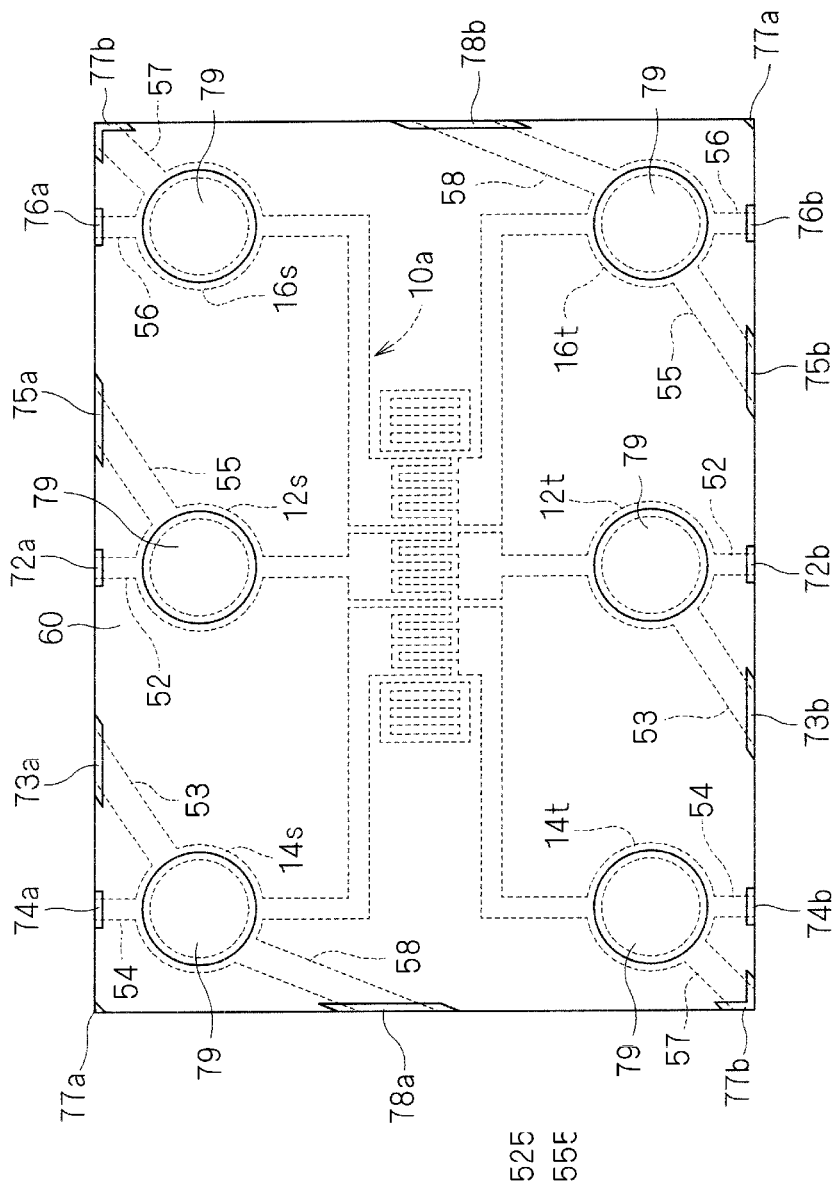
FIG. 17 is a plan view of the elastic wave apparatus illustrating a manufacturing step of the elastic wave apparatus according to the third preferred embodiment of the present invention.

A method for manufacturing an elastic wave device according to a third preferred embodiment of the present invention is described below with reference to FIGS. 10A-1 to 17. FIGS. 10A-1 to 12I'-2 are cross-sectional views of a main portion of an elastic wave apparatus illustrating steps of manufacturing the elastic wave apparatus. Cross-sectional views of a main portion on the left side schematically illustrate a portion of a dicing area in which a power supply line is formed, whereas cross-sectional views of a main portion on the right side schematically illustrate a portion of the dicing area in which a power supply line is not formed. FIGS. 13 to 17 are plan views illustrating manufacturing steps of the elastic wave apparatus.

The method for manufacturing an elastic wave apparatus according to a third preferred embodiment is substantially the same as the method for manufacturing an elastic wave apparatus according to the first or second preferred embodiments. In the following description, the same numbering will be used in describing the method for manufacturing an elastic wave device according to the third preferred embodiment as was utilized in describing the method for manufacturing the elastic wave apparatus according to the first or second preferred embodiment, and the differences are mainly described below.

Figures 1, 10B:
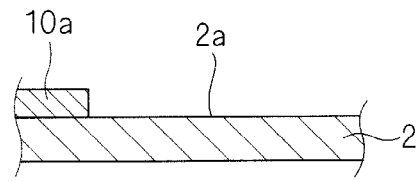
Figures 2, 10B:
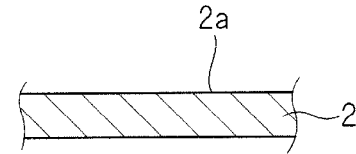

First, as shown in FIGS. 10A-1 and 10A-2, a piezoelectric substrate 2 is prepared. Subsequently, as shown in FIGS. 10B-1 and 10B-2, similar to the second preferred embodiment, a conductive layer 10a is preferably formed on a surface 2a of the piezoelectric substrate 2. For example, a first electrode layer is formed on the surface 2a of the piezoelectric substrate 2 using, for example, a vapor deposition method or a sputtering method. Subsequently, a photoresist is applied, exposed, and developed. Thus, a mask pattern is formed. Thereafter, dry etching or wet etching is conducted through the mask pattern. Thus, the first electrode layer is etched, and a conductive layer 10a is formed. Thereafter, the mask pattern is removed.

Figures 1, 10C:
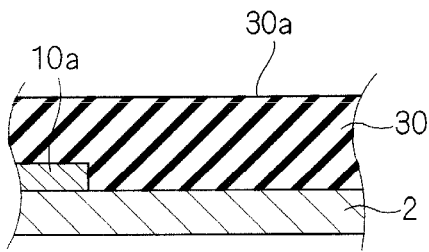
Figures 2, 10C:
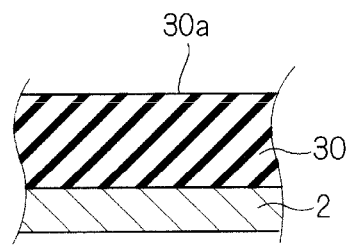

Subsequently, as shown in FIGS. 10C-1 and 10C-2, an insulating layer 30 preferably made of SiO$_2$, for example, is formed on the surface 2a of the piezoelectric substrate 2 and the first conductive layer 10a by a sputtering method or an applying method, for example, so as to cover the entire or substantially the entire surface. Subsequently, as shown in FIGS. 10D-1 and 10D-2 and FIG. 13, a portion of the insulating layer 30 is preferably removed so that pad openings 32a, 32b, 34a, 34b, 36a, and 36b and a boundary opening 38 are formed. The pad openings 32a, 32b, 34a, 34b, 36a, and 36b are formed in order to expose the pad 12s, 12t, 14s, 14t, 16s, and 16t of the first conductive layer 10a, respectively. The boundary opening 38 is formed in order to expose the surface 2a of the piezoelectric substrate 2 in a dicing area.

Figures 1, 10D:
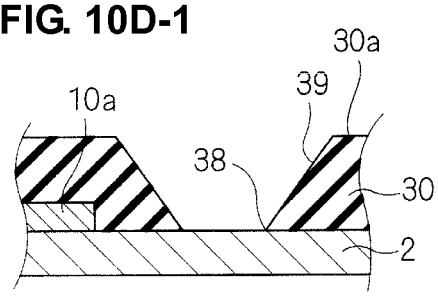
Figures 2, 10D:
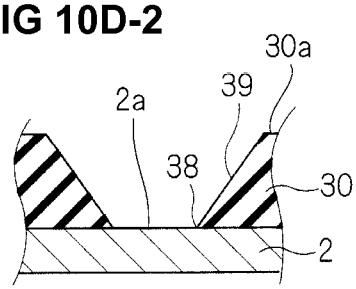
Figures 1, 10E:
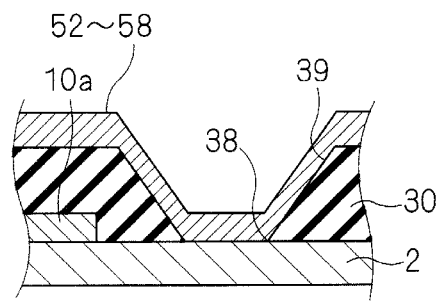
Figures 2, 10E:
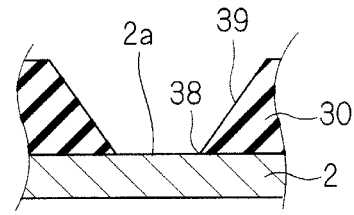

For example, a photoresist is applied onto the insulating layer 30. Thereafter, the photoresist is exposed to light and is developed. Thus, a mask pattern is formed. After the pad openings 32a, 32b, 34a, 34b, 36a, and 36b and the boundary opening 38 are formed in the insulating layer 30 using a dry etching method or a wet etching method, the mask pattern is removed. In the etching step, when, for example, ICP-RIE (Inductive Coupled Plasma-Reactive Ion Etching) using $CF_4$ is conducted, the insulating layer 30 is formed so as to have a tapered shape in cross section in the vicinity of the pad openings and the boundary opening 38, as shown in FIGS. 10D-1 and 10D-2. Thus, slopes 39 are formed between each of the pad openings and an upper surface 30a of the insulating layer 30 and between the boundary opening 38 and the upper surface 30a. It should be noted that an etching method is not limited to ICP-RIE using $CF_4$. For example, a dry etching method or a wet etching method may be used.

Subsequently, as shown in FIGS. 10E-1 and 10E-2 and FIG. 14, a third electrode layer 50 including power supply lines 52 to 58 is preferably formed on the insulating layer 30 and a portion of the surface 2a of the piezoelectric substrate 2 that is exposed through the boundary opening 38 of the insulating layer 30. For example, a third electrode layer is formed on the surface 2a of the piezoelectric substrate 2 using, for example, a vapor deposition method or a sputtering method. Subsequently, a photoresist is applied, exposed, and developed. Thus, a mask pattern is formed. Thereafter, dry etching or wet etching is conducted through the mask pattern. Thus, the third electrode layer 50 is formed. Thereafter, the mask pattern is removed.

By forming the third electrode layer 50, the following elements (a) and (b) are preferably formed: (a) pad upper layers 52s, 52t, 54s, 54t, 56s, and 56t formed on pads 12s, 12t, 14s, 14t, 16s, and 16t of the first conductive layer 10a that are exposed through the pad openings 32a, 32b, 34a, 34b, 36a, and 36b of the insulating layer 30, respectively, and (b) the power supply lines 52 to 58 that connect the pad 12s to the pad 12t, the pad 12t to the pad 14s, the pad 14s to the pad 14t, the pad 12s to the pad 16t, the pad 14t to the pad 16s, and the pad 14s to the pad 16t in the portions which define elastic wave devices and which are adjacent to each other with a dicing area therebetween.

Figures 1, 11F:
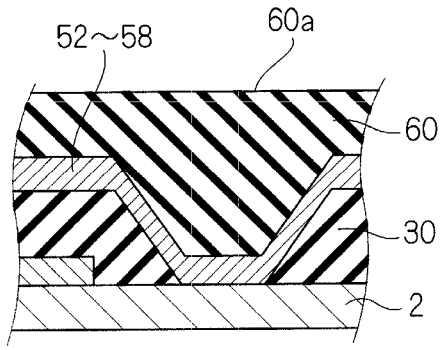
Figures 2, 11F:
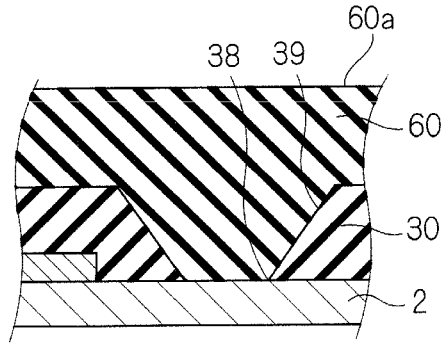

Subsequently, as shown in FIGS. 11F-1 and 11F-2, a second insulating layer 60 preferably made of SiN, for example, is formed on the insulating layer 30 and the third electrode layer 50 by a vapor deposition method, a sputtering method, or an applying method so as to cover the entire or substantially the entire surface. In the present preferred embodiment, $SiO_2$ is preferably used for the insulating layer 30, and SiN is preferably used for the second insulating layer 60, for example. However, the material of the second insulating layer 60 may be the same as the material of the insulating layer 30, for example. Alternatively, Si, glass, SiC, SiN, TiO, TiN, Ta2O5, AlN, Al2O3, C3N4, polyimide, or an epoxy-based resin may be used as the material of the second insulating layer 60, for example. Still alternatively, a widely used photoresist material may be used, for example.

Figures 1, 11G:
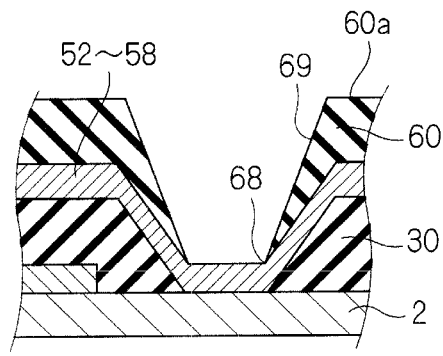
Figures 2, 11G:
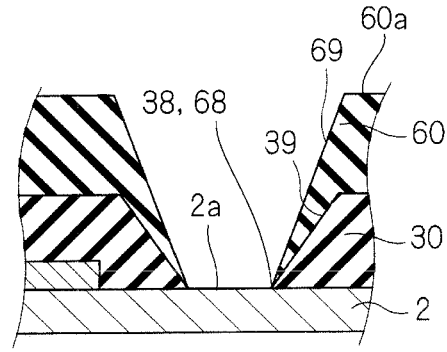
Figures 1, 11H:
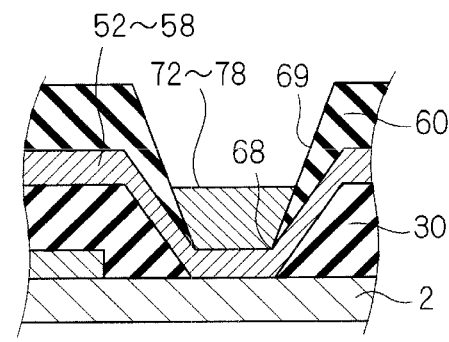
Figures 2, 11H:
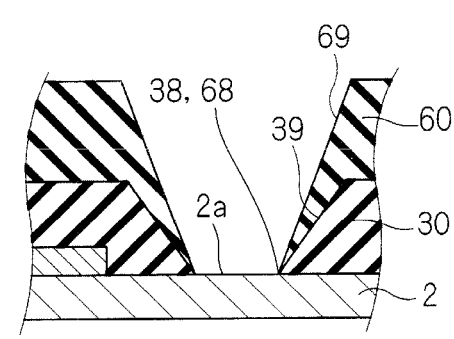
Figure 15:
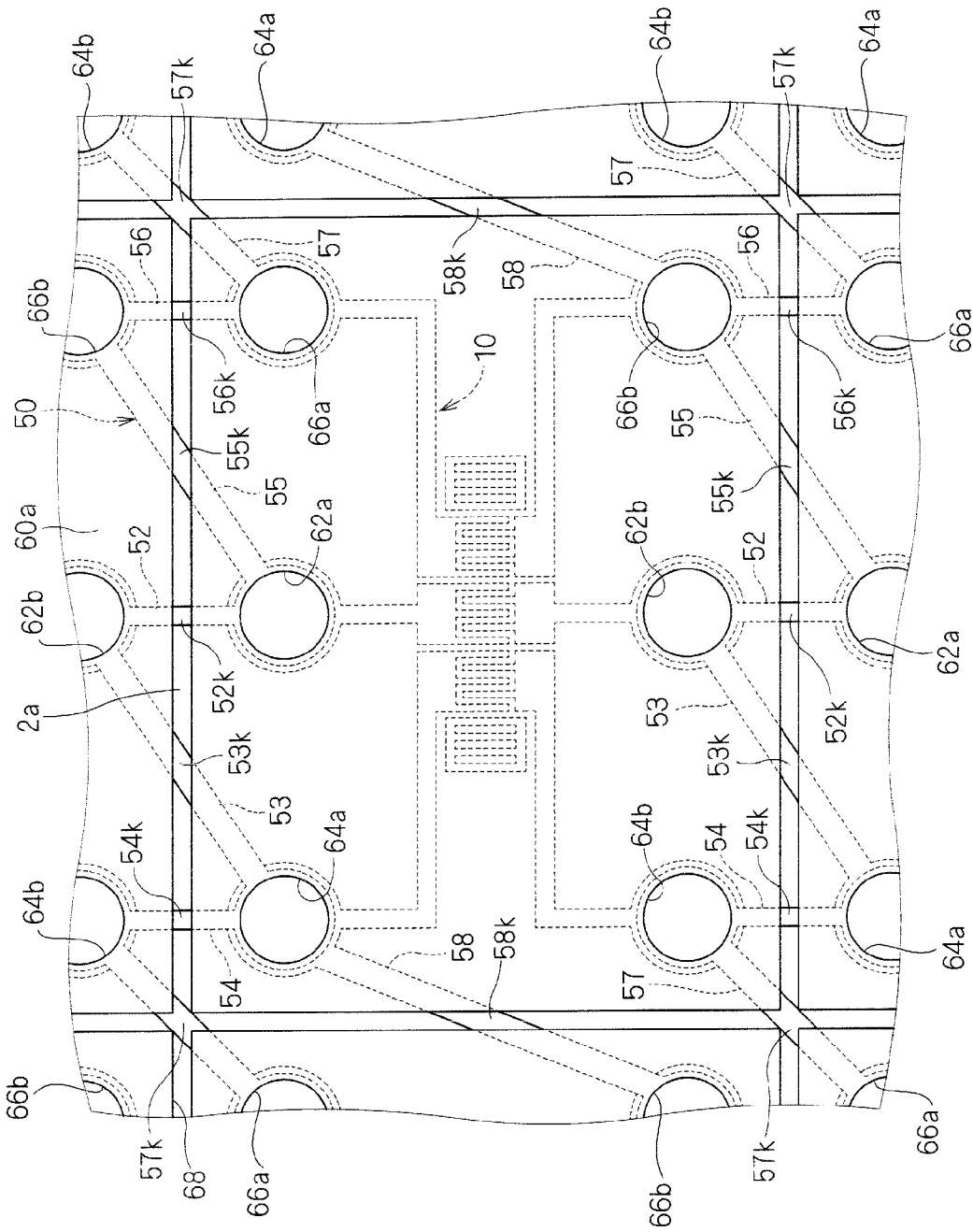
FIG. 15 is a plan view of the elastic wave apparatus illustrating a manufacturing step of the elastic wave apparatus according to the third preferred embodiment of the present invention.
Figure 16:
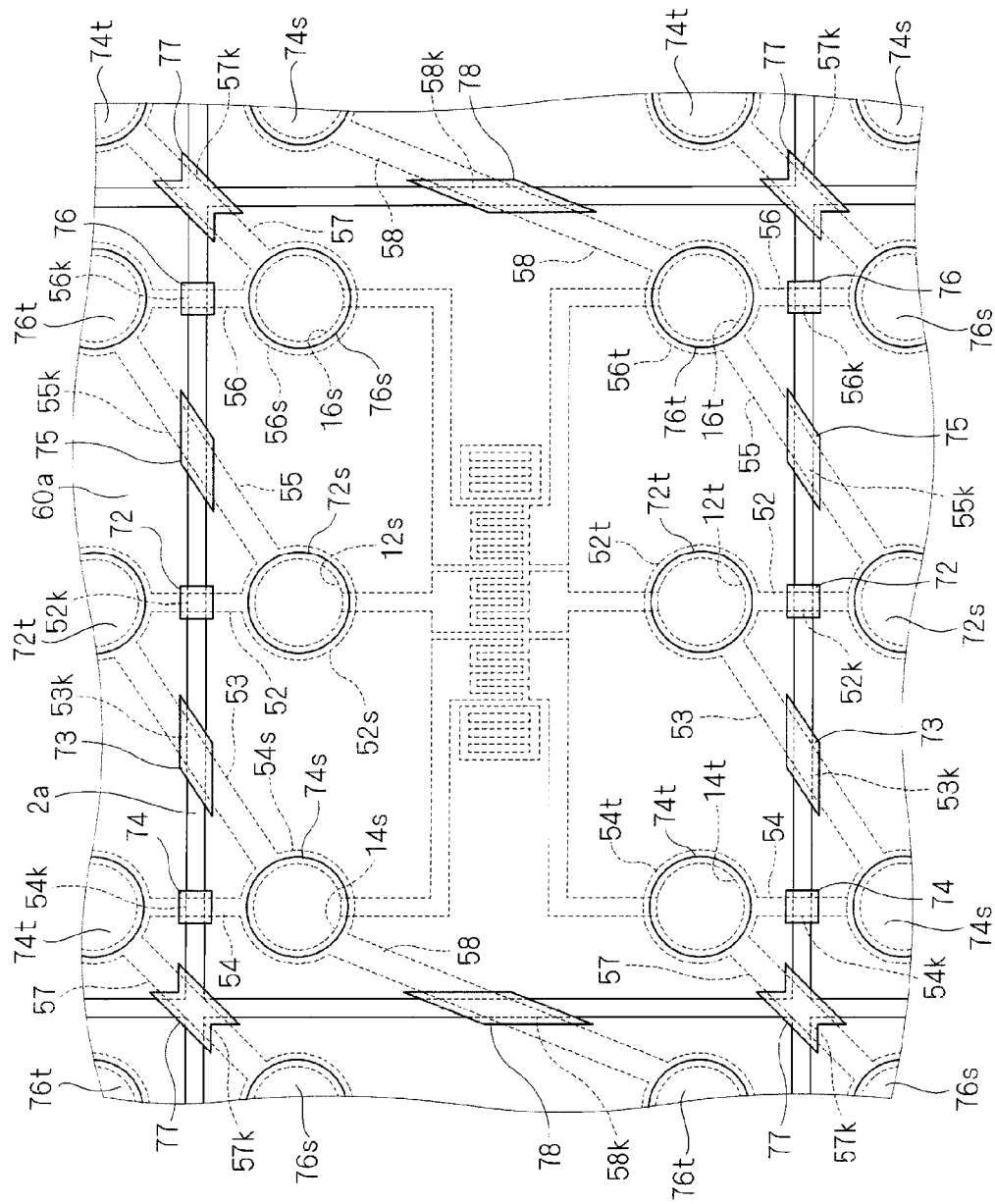
FIG. 16 is a plan view of the elastic wave apparatus illustrating a manufacturing step of the elastic wave apparatus according to the third preferred embodiment of the present invention.

Subsequently, as shown in FIG. 15, pad openings 62a, 62b, 64a, 64b, 66a, and 66b are formed. The pad openings 62a, 62b, 64a, 64b, 66a, and 66b are formed in the second insulating layer 60 in order to expose the pad upper layers 52s, 52t, 54s, 54t, 56s, and 56t of the third electrode layer 50, respectively. In addition, as shown in FIGS. 11G-1 and 11G-2, a boundary opening 68 is preferably formed so as to correspond to the boundary opening 38 in the insulating layer 30 in order to expose the surface 2a of the piezoelectric substrate 2 and the power supply lines 52 to 58 of the third electrode layer 50 in the dicing area.

Subsequently, as shown in FIGS. 11H-1 and 11H-2 and FIG. 16, power is preferably applied to the power supply lines to 58 in the third electrode layer 50. While external electrical charge is being supplied, electrolytic plating is conducted. Thus, plating layers 72s, 72t, 74s, 74t, 76s, and 76t that define an under bump metal are formed on the pad upper layers 52s, 52t, 54s, 54t, 56s, and 56t exposed through the pad openings 62a, 62b, 64a, 64b, 66a, and 66b, respectively. At the same time, plating layers 72 to 78 are formed on the portions 52k to 58k of the power supply lines 52 to 58 of the third electrode layer 50 exposed through the boundary opening 68, respectively. The plating layers 72s, 72t, 74s, 74t, 76s, and 76t and the plating layers 72 to 78 are also preferably formed on slopes 69 that continuously extend from the pad openings 62a, 62b, 64a, 64b, 66a, and 66b of the second insulating layer 60 and the boundary opening 68. Accordingly, the plating layers 72s, 72t, 74s, 74t, 76s, and 76t and the plating layers 72 to 78 are formed so as to extend outside the pad openings 62a, 62b, 64a, 64b, 66a, and 66b of the resist or the second insulating layer 60 and the boundary opening 68.

External terminals 79 (shown in FIG. 17 described below) are preferably formed on the plating layers 72s, 72t, 74s, 74t, 76s, and 76t formed in the pad openings 62a, 62b, 64a, 64b, 66a, and 66b of the second insulating layer 60. For example, the external terminals 79 are preferably metal bumps, such as solder bumps.

Figures 1, 11I:
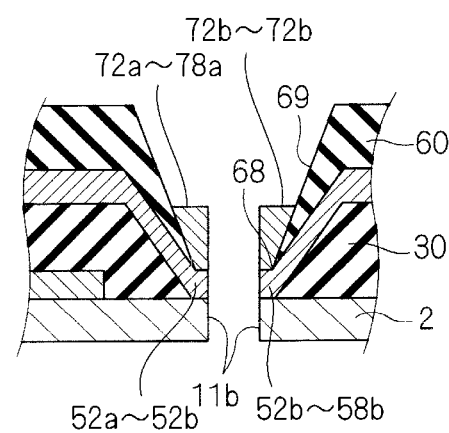
Figures 2, 11I:
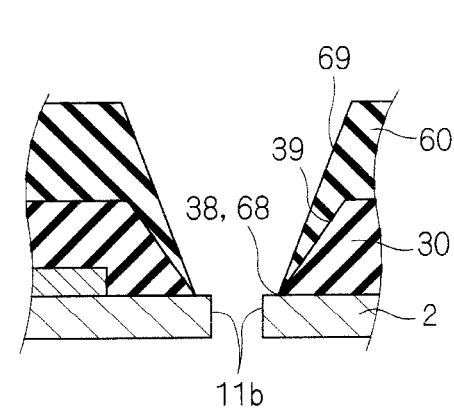

Subsequently, as shown in FIGS. 11I-1 and 11I-2 and FIG. 17, by cutting the piezoelectric substrate 2, the power supply lines 52 to 58 of the third electrode layer 50, and the plating layers 72 to 78 in an area exposed through the boundary opening 68 of the resist or the second insulating layer 60, the mother substrate is separated into components each defining an elastic wave device. As shown in FIG. 11I-1, cross sections 52a to 58a and cross sections 52b to 58b of the power supply lines 52 to 58 that cross the dicing area are formed on side surfaces 11b of the separated component defining an elastic wave device. In addition, if portions 72a to 78a and portions 72b to 78b of the plating layers 72 to 78 remain, the remaining portions 72a to 78a and remaining portions 72b to 78b become exposed along the side surfaces 11b of the components defining an elastic wave device, as shown in FIG. 17.

Figure 12H:
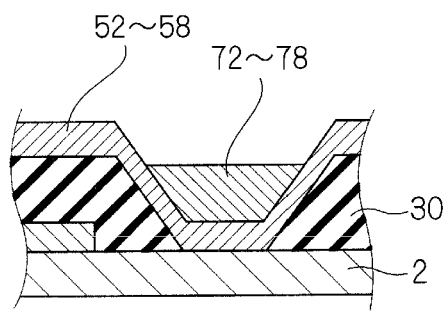
FIGS. 12H'-1 to 12I'-2 are cross-sectional views of a main portion of an elastic wave apparatus illustrating manufacturing steps of the elastic wave apparatus according to the third preferred embodiment of the present invention.
Figure 12H:
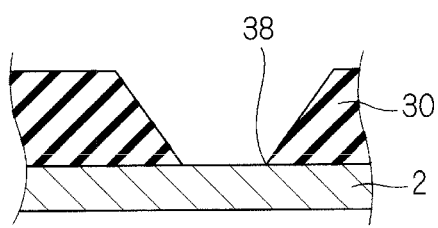
Figure 12I:
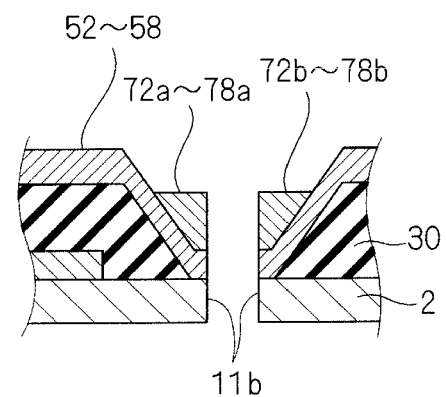
Figure 12I:
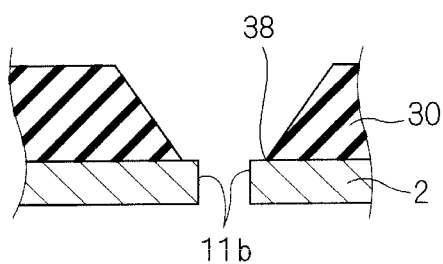
Figure 13:
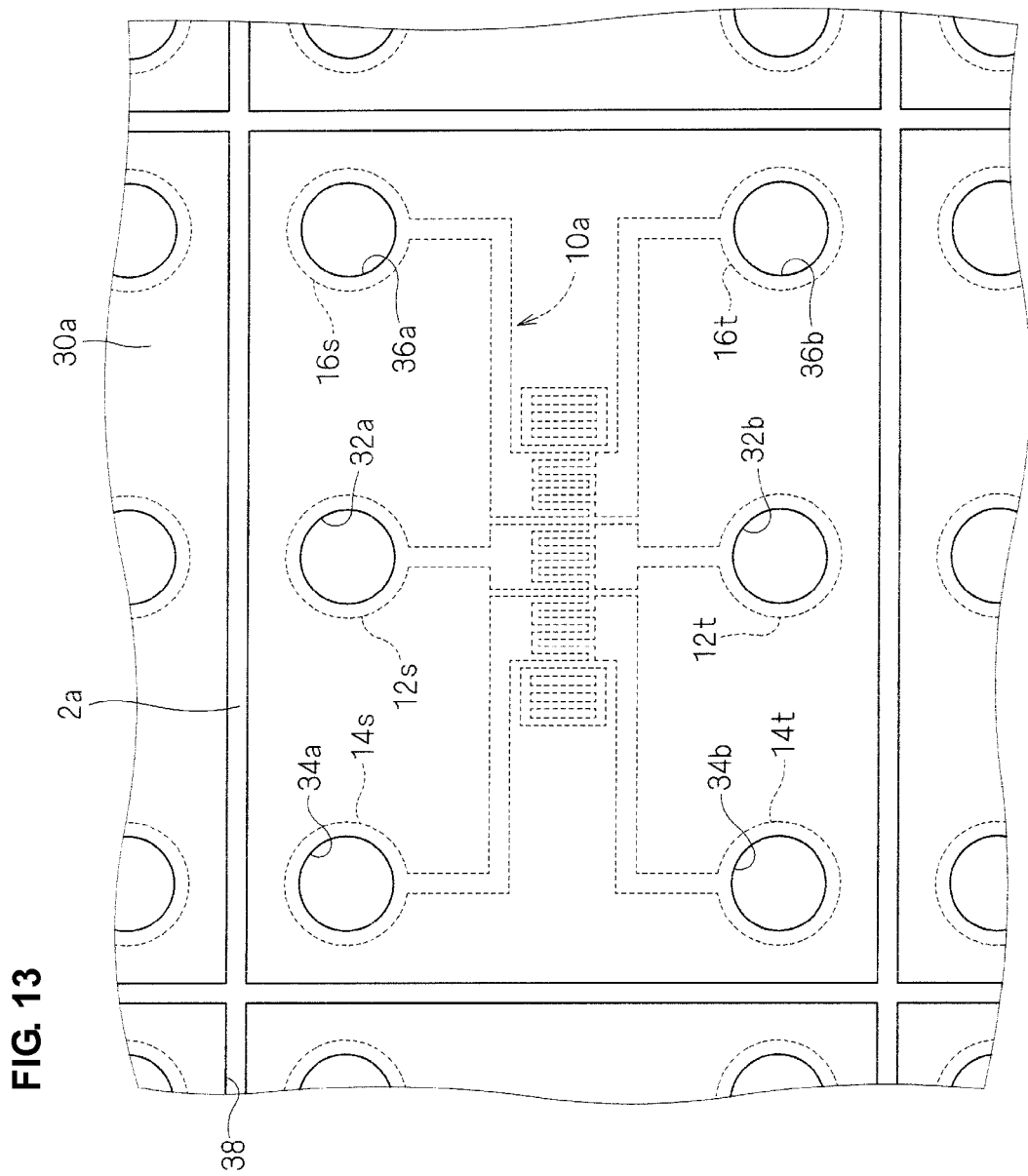
FIG. 13 is a plan view of the elastic wave apparatus illustrating a manufacturing step of the elastic wave apparatus according to the third preferred embodiment of the present invention.
Figure 14:
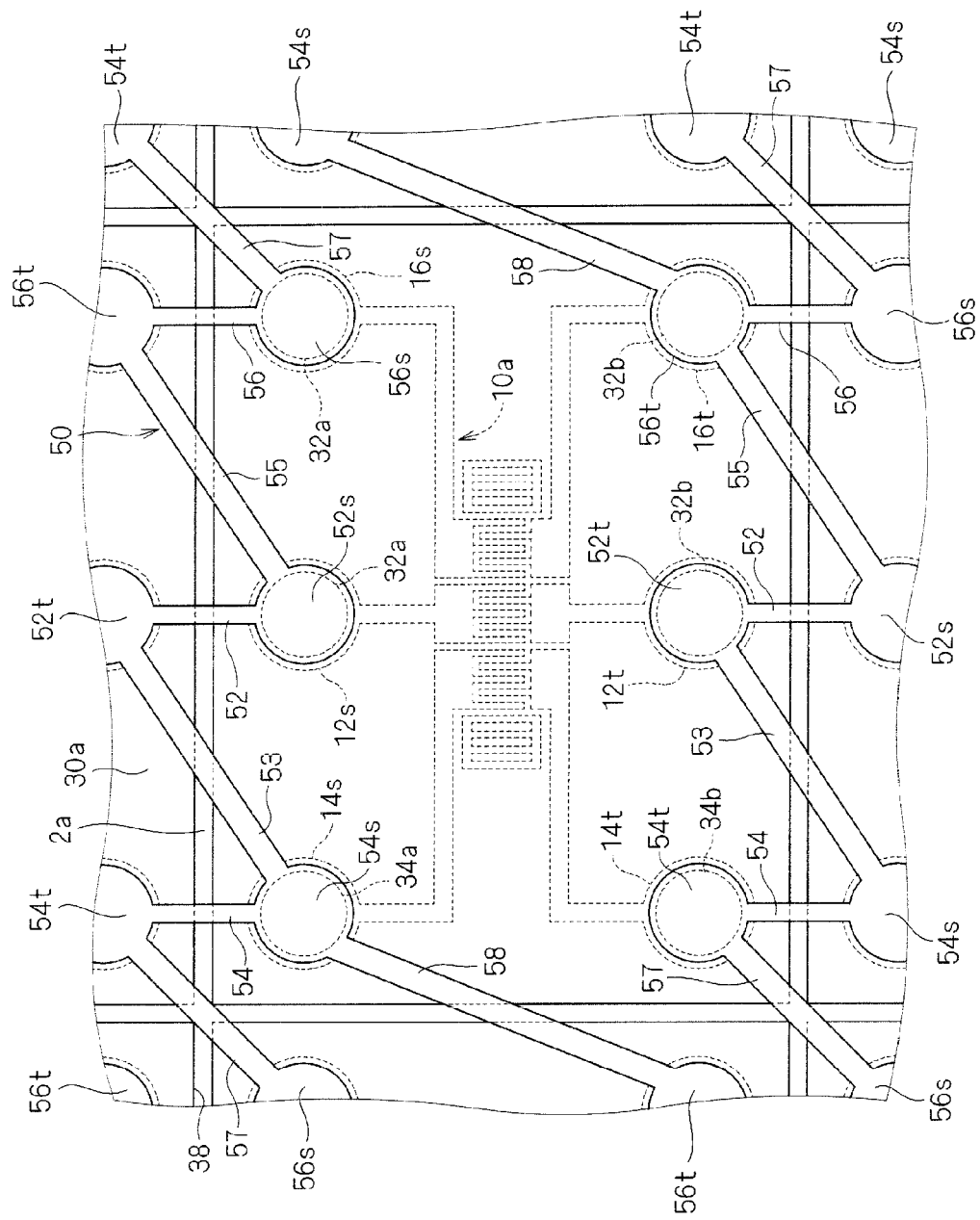
FIG. 14 is a plan view of the elastic wave apparatus illustrating a manufacturing step of the elastic wave apparatus according to the third preferred embodiment of the present invention.

When the second insulating layer 60 is removed, the second insulating layer 60 is removed as shown in FIGS. 12H'-1 and 12H'-2. Thereafter, as shown in FIGS. 12I'-1 and 12I'-2, the mother substrate is cut into the individual components each defining an elastic wave device.

A separated component defining an elastic wave device is mounted on a mounting substrate via the external terminal 79. Thereafter, the elastic wave device is preferably shielded with, for example, a resin as needed. Thus, an elastic wave apparatus is provided.

In the above-described manufacturing method according to the third preferred embodiment, operations and advantages that are the same as those achieved by the first and second preferred embodiments are provided.

Furthermore, in the manufacturing method according to the third preferred embodiment, the plating layer is preferably formed on the third electrode layer. Accordingly, a metal to which plating is securely adhered can be used as a top portion of the third electrode layer. In contrast, the first electrode layer that forms element portions, such as an IDT, need not have easy connectivity with plating. Accordingly, the flexibility of selection of materials used for the layer structure of the conductive layer can be increased.

Fourth Preferred Embodiment

Figures 1, 18A:
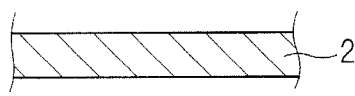
Figures 2, 18A:
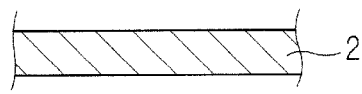

A method for manufacturing an elastic wave device according to a fourth preferred embodiment of the present invention is described below with reference to FIGS. 18A-1 and 19. FIGS. 18A-1 to 18F-2 are cross-sectional views of a main portion of an elastic wave apparatus illustrating steps of manufacturing the elastic wave apparatus. A cross-sectional view of the main portion on the left side schematically illustrates a portion of a dicing area in which a power supply line is formed, whereas a cross-sectional view of the main portion on the right side schematically illustrates a portion of the dicing area in which a power supply line is not formed. FIG. 19 is a plan view illustrating manufacturing steps of the elastic wave apparatus.

The method for manufacturing an elastic wave apparatus according to the fourth preferred embodiment is substantially the same as the method for manufacturing an elastic wave apparatus according to the first preferred embodiment except that only a pad opening is formed in an insulating layer and, therefore, a boundary opening that exposes a dicing area of the piezoelectric substrate is not formed. In the following description, the same numbering will be used in describing the method for manufacturing an elastic wave device according to the fourth preferred embodiment as was utilized in describing the method for manufacturing the elastic wave apparatus according to the first preferred embodiment, and the differences are mainly described below.

Figures 1, 18B:
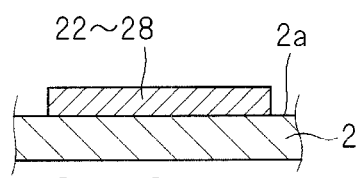
Figures 2, 18B:
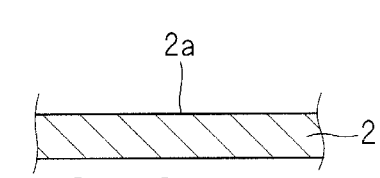

First, as shown in FIGS. 18A-1 and 18A-2, a piezoelectric substrate 2 is prepared. Subsequently, as shown in FIGS. 18B-1 and 18B-2, similar to the first preferred embodiment (refer to FIGS. 1A-1 to 1F-2), a conductive layer 10 and power supply lines 22 to 28 are preferably formed on a surface 2a of the piezoelectric substrate 2. For example, an electrode layer is formed on the surface 2a of the piezoelectric substrate 2 using, for example, a vapor deposition method or a sputtering method. Subsequently, a photoresist is applied, exposed, and developed. Thus, a mask pattern is formed. Thereafter, dry etching or wet etching is conducted through the mask pattern. Thus, the electrode layer is etched, and the conductive layer 10 and power supply lines 22 to 28 are formed. Thereafter, the mask pattern is removed.

Figures 1, 18C:
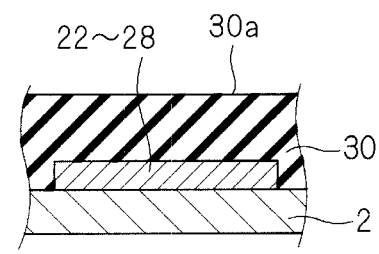
Figures 2, 18C:
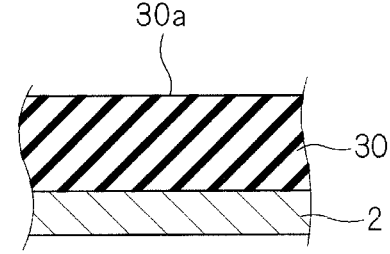
Figures 1, 18D:
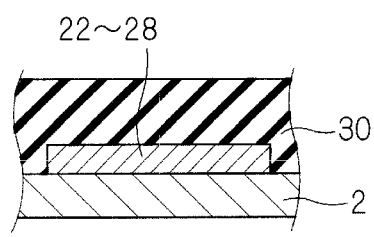
Figures 2, 18D:
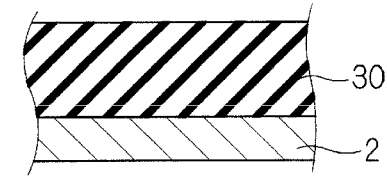
Figures 1, 18E:
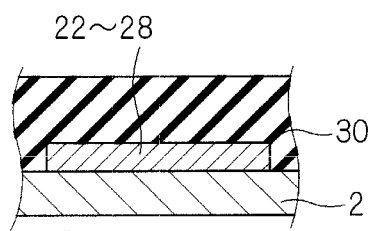
Figures 2, 18E:
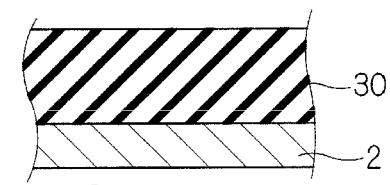

Subsequently, as shown in FIGS. 18C-1 and 18C-2, an insulating layer 30 is preferably formed, using, for example, a sputtering method or an applying method, on the surface 2a of the piezoelectric substrate 2 having the conductive layer 10 and the power supply lines 22 to 28 formed thereon so as to cover the entire or substantially the entire surface.

Subsequently, as shown in FIGS. 18D-1 and 18D-2 and FIG. 19, a portion of the insulating layer 30 is preferably removed so that only pad openings 32a, 32b, 34a, 34b, 36a, and 36b are formed. The pad openings 32a, 32b, 34a, 34b, 36a, and 36b are formed in order to expose the pad 12s, 12t, 14s, 14t, 16s, and 16t of the conductive layer 10, respectively. However, unlike the first preferred embodiment, a boundary opening is not formed in the insulating layer 30. For example, a photoresist is preferably applied onto the insulating layer 30, is exposed to light, and is developed. Thus, a mask pattern is formed. Thereafter, dry etching or wet etching is conducted through the mask pattern. Thus, the pad openings 32a, 32b, 34a, 34b, 36a, and 36b are formed in the insulating layer 30. Thereafter, the mask pattern is removed.

Subsequently, as shown in FIGS. 18E-1 and 18E-2 and FIG. 20, power is preferably applied to the power supply lines 22 to 28. While external electrical charge is being supplied, electrolytic plating is conducted. Thus, plating layers 42s, 42t, 44s, 44t, 46s, and 46t that define an under bump metal are formed on the pads 12s, 12t, 14s, 14t, 16s, and 16t exposed through the pad openings 32a, 32b, 34a, 34b, 36a, and 36b, respectively.

Figure 21:
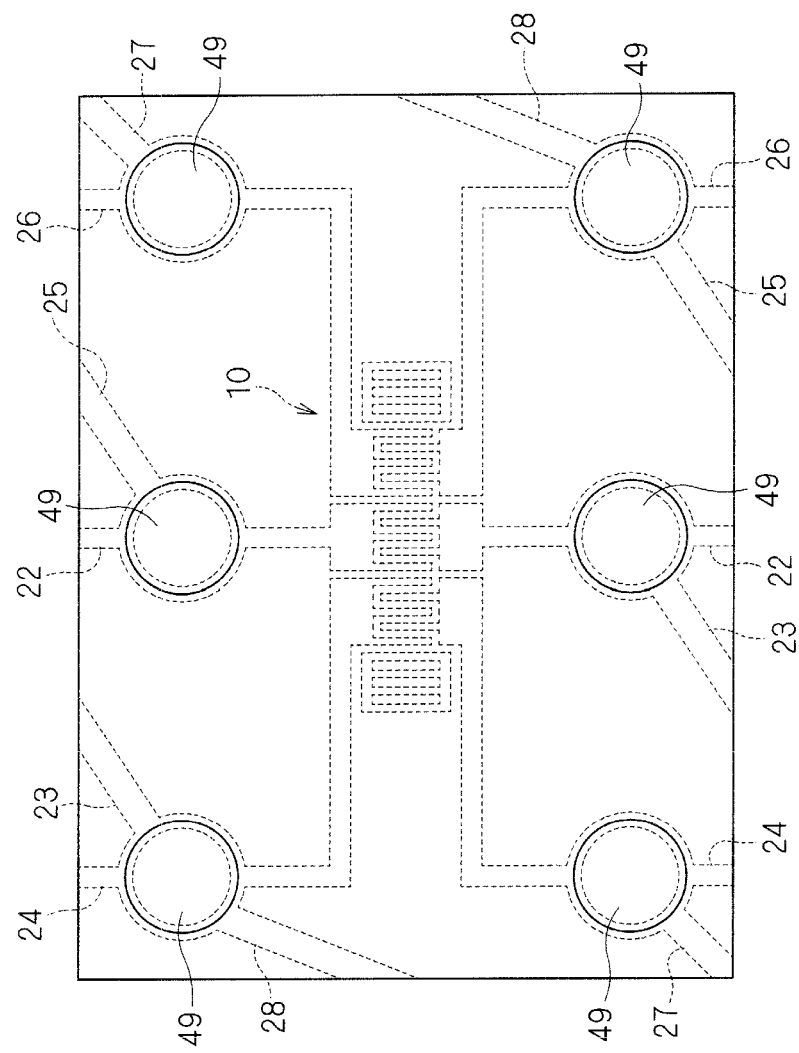
FIG. 21 is a plan view of the elastic wave apparatus illustrating a manufacturing step of the elastic wave apparatus according to the fourth preferred embodiment of the present invention.

Subsequently, external terminals 49 (shown in FIG. 21 described below) are preferably formed on the plating layers 42s, 42t, 44s, 44t, 46s, and 46t formed in the pad openings 32a, 32b, 34a, 34b, 36a, and 36b of the insulating layer 60. For example, the external terminals are preferably metal bumps, such as solder.

Figures 1, 18F:
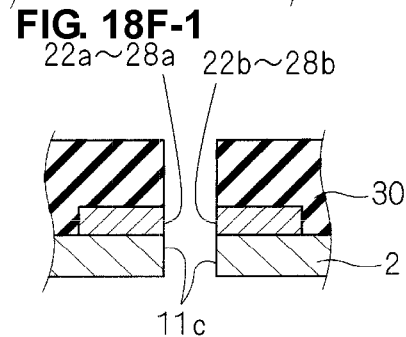
Figures 2, 18F:
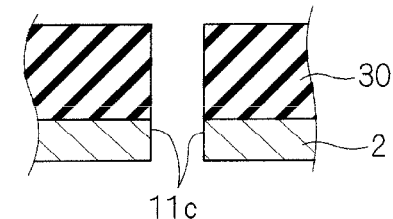
Figure 19:
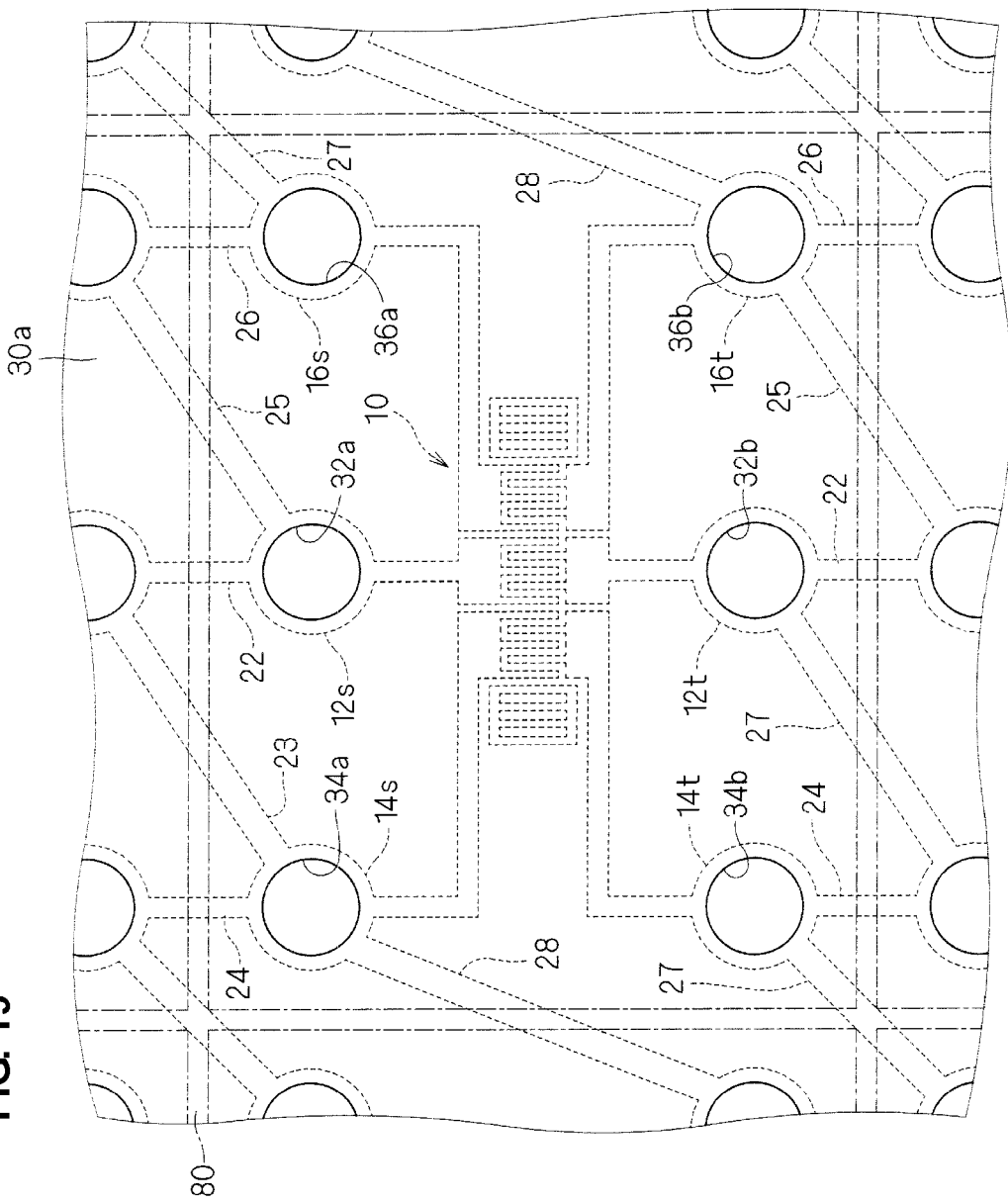
FIG. 19 is a plan view of the elastic wave apparatus illustrating a manufacturing step of the elastic wave apparatus according to the fourth preferred embodiment of the present invention.
Figure 20:
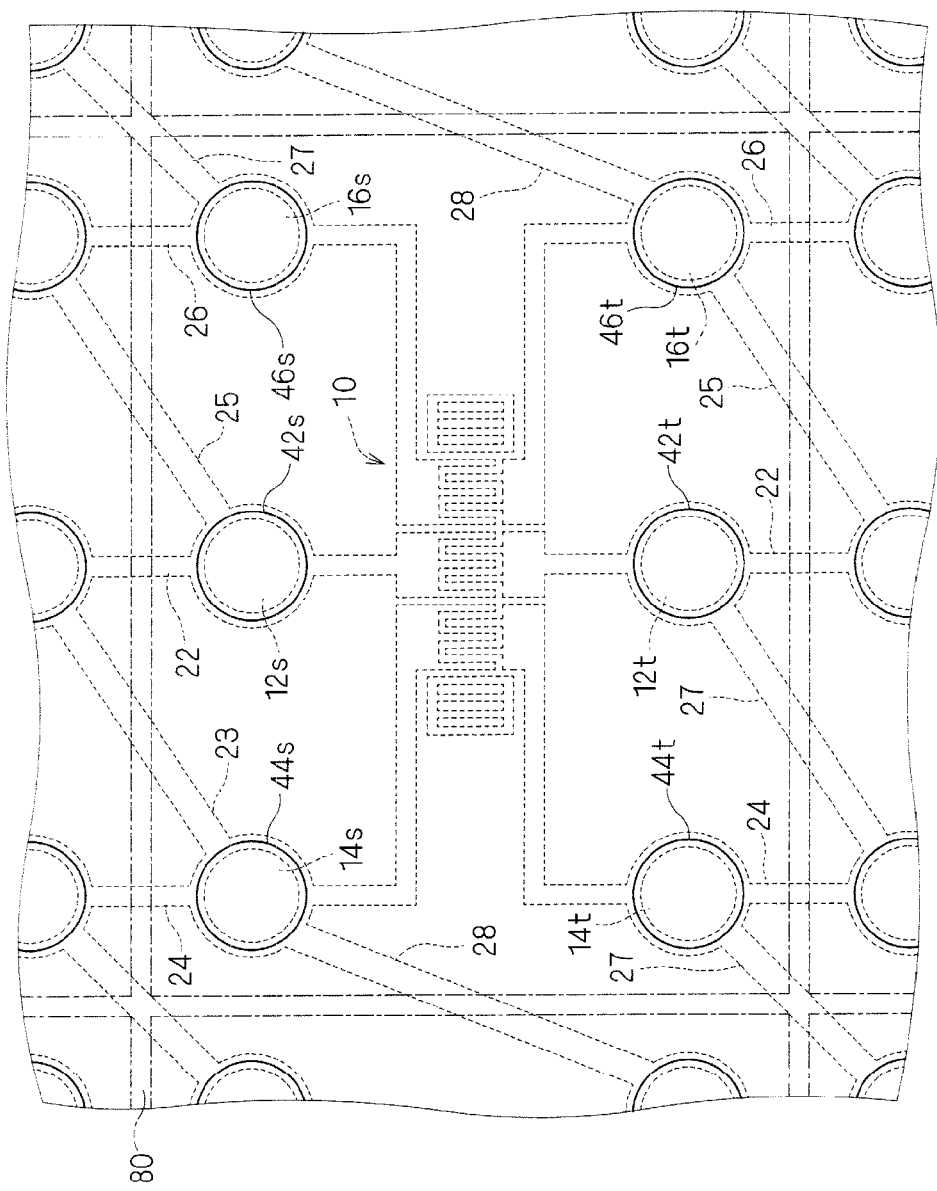
FIG. 20 is a plan view of the elastic wave apparatus illustrating a manufacturing step of the elastic wave apparatus according to the fourth preferred embodiment of the present invention.

Subsequently, as shown in FIGS. 18F-1 and 18F-2 and FIG. 21, the piezoelectric substrate 2, the power supply lines 22 to 28, and the insulating layer 30 in the dicing area are cut. Thus, the mother substrate is cut and separated into components each defining an elastic wave device. As shown in FIG. 18F-1, cutting planes 22a to 28a and cutting planes 22b to 28b of the power supply lines 22 to 28 that cross the dicing area are formed on side surfaces 11c of the separated component defining an elastic wave device.

For example, the piezoelectric substrate 2, the power supply lines 22 to 28, and the plating layers 42 to 48 present in the dicing area are preferably cut by using a dicing blade and are removed.

A separated component defining an elastic wave device is preferably mounted on a mounting substrate via the external terminal 49. Thereafter, the elastic wave device is preferably shielded with, for example, a resin as desired. Thus, an elastic wave apparatus is achieved.

Figure 22:
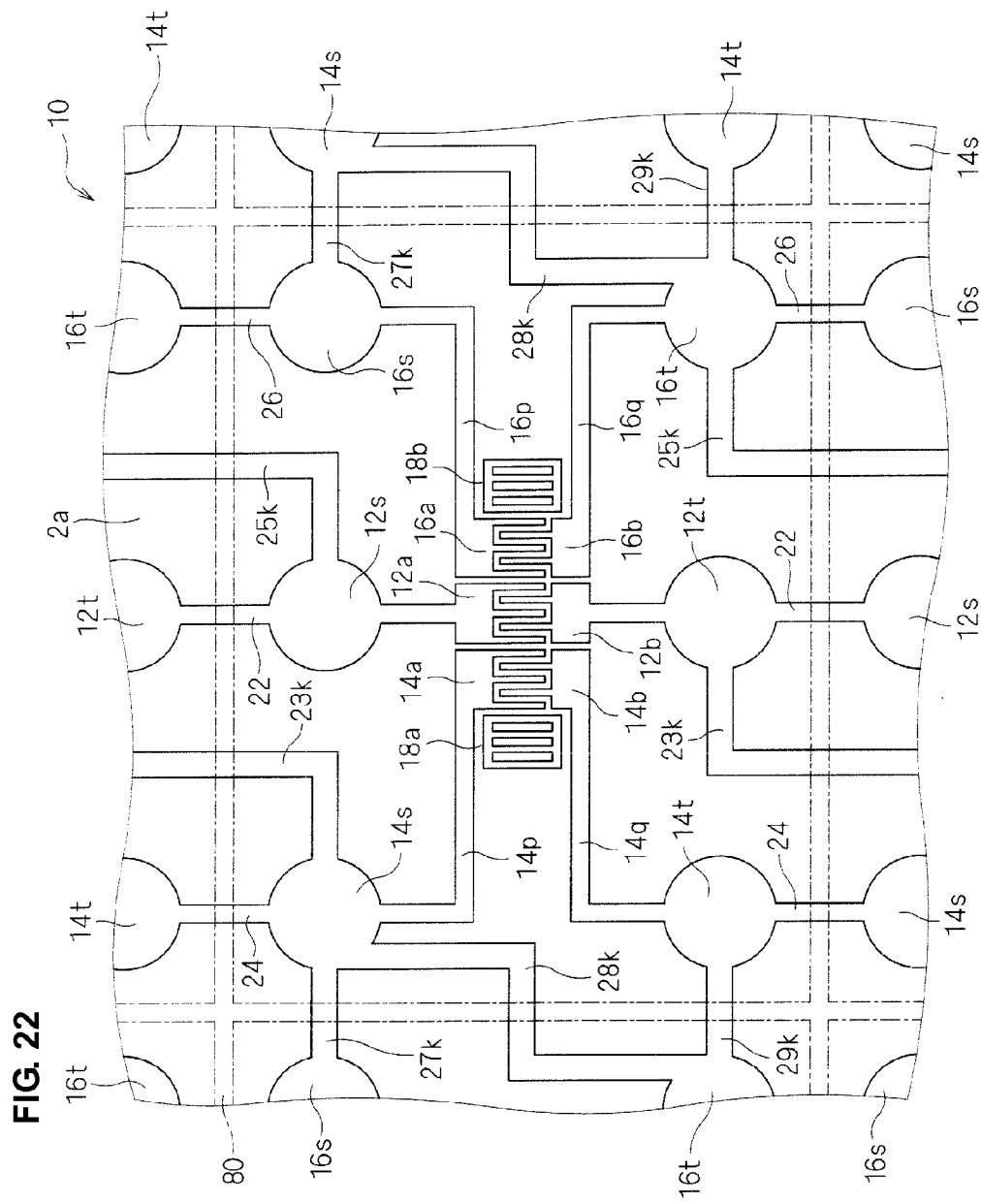
FIG. 22 is a plan view of a piezoelectric substrate according to a modification of a preferred embodiment of the present invention.

According to the above-described manufacturing method of the fourth preferred embodiment, in the dicing step for separating a mother substrate into components each defining as an elastic wave device, it is not necessary to completely remove the power supply lines. Therefore, when dicing step is performed using a blade, the width of the dicing area can be reduced. Thus, a blade having a large width is not needed. As a result, the ratio of occupation of the components defining elastic wave devices to the area of the mother substrate is increased. Furthermore, since a plating layer is not formed in the dicing area, the plating layer need not be removed in the dicing step. A modification of a preferred embodiment of the present invention is described below with reference to plan views in FIGS. 22 and 23. FIG. 22 is a plan view of a piezoelectric substrate. FIG. 23 is a perspective view of a component that is obtained by separating a mother substrate and that defines an elastic wave device.

In the first to fourth preferred embodiments, among the power supply lines, only the power supply lines 23, 25, 27, and 28 diagonally cross the dicing area. However, in the modification, as shown in FIGS. 22 and 23, all of the power supply lines 22, 23k, 24, 25k, 26, 27k, and 28k are preferably formed so as to perpendicularly or substantially perpendicularly cross a dicing area 80.

As described above, when θ represents the angle formed by the power supply line having a width of W and the dicing area, a length L of a portion of the power supply line appearing on the side surface of the component defining an elastic wave device, which is separated from the mother substrate, is expressed as: L=W/sin θ. If the power supply line perpendicularly crosses the dicing area, that is, if θ=90°, L=W. That is, L has a minimum value.

Figure 23:
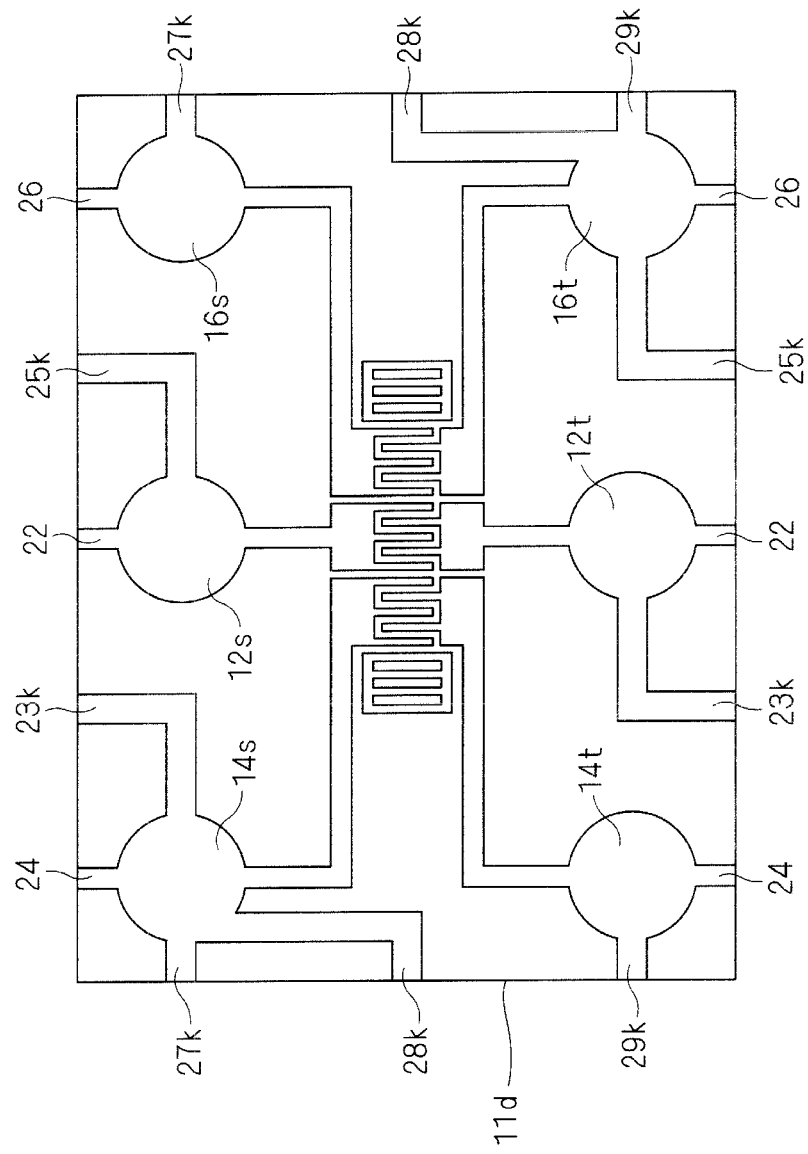
FIG. 23 is a perspective view of the piezoelectric substrate according to a modification of a preferred embodiment of the present invention.
Figure 26A:
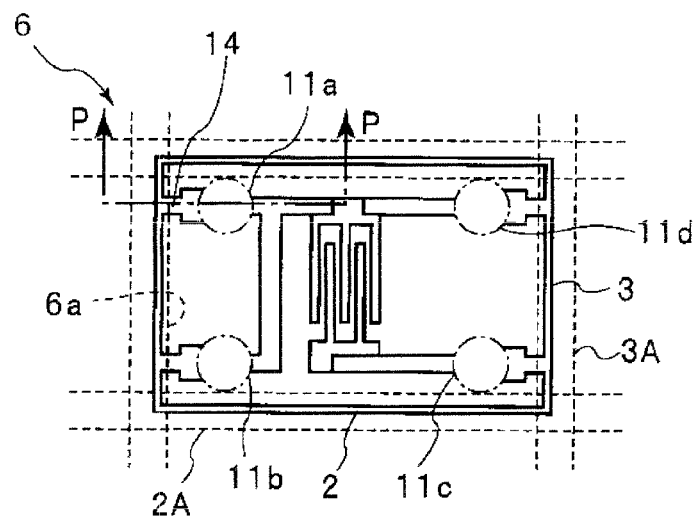
FIG. 26A is a plan view of a conventional elastic wave apparatus.
Figure 26B:
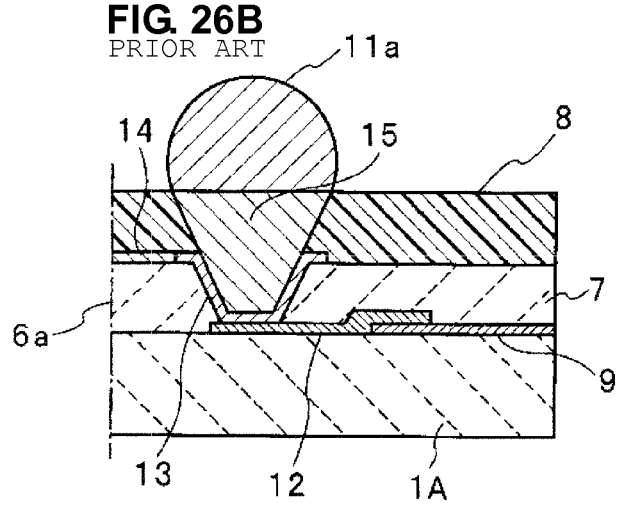
FIG. 26B is a plan view of the conventional elastic wave apparatus.
Figure 27A:
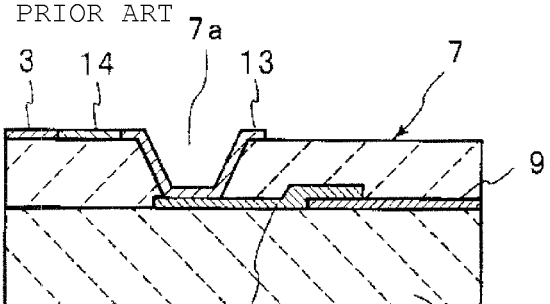
FIGS. 27A-27D are cross-sectional views showing manufacturing steps of a conventional elastic wave apparatus.
Figure 27B:
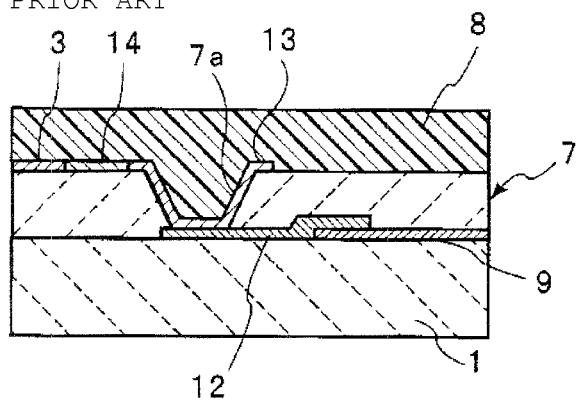
Figure 27C:
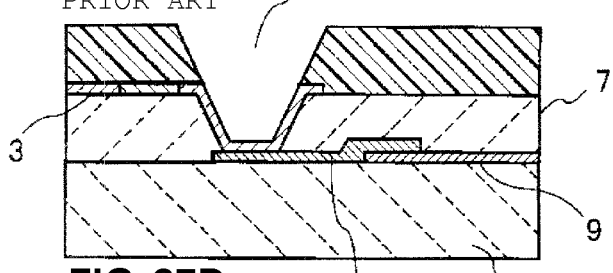
Figure 27D:
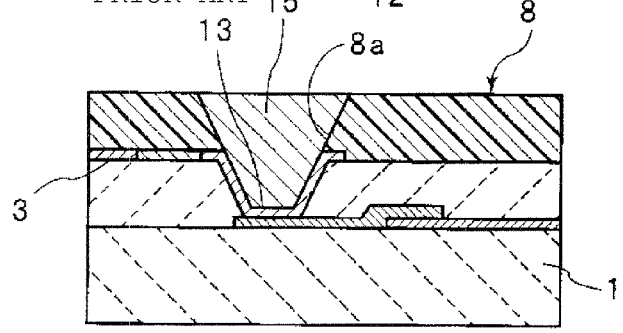

Accordingly, if, as shown in FIG. 22, all of the power supply lines are formed so as to perpendicularly or substantially perpendicularly cross the dicing area 80, the length of the power supply line appearing on a side surface 11d of a component that is obtained by separating the mother substrate and that defines an elastic wave device is minimized, as shown in FIG. 23.

As described above, by forming the power supply line that connects between pads so as to cross the dicing area perpendicularly, substantially perpendicularly, or diagonally, the mother substrate can be efficiently separated into components that define elastic wave devices.

It should be noted that the present invention is not limited to the above-described preferred embodiments, and various modifications can be made. While the foregoing preferred embodiments have been described with reference to elastic wave devices, as an example, the present invention may be applied to another electronic component, such as a semiconductor device, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a component obtained by separating a mother substrate including a plurality of components to define a plurality of individual devices, the component including a conductive layer, an insulating layer, a first plating layer, an external terminal, and a plurality of power supply lines, the conductive layer including an electrode and a plurality of pads, the insulating layer being disposed on a surface of the mother substrate so as to cover a portion of the conductive layer and including pad openings each surrounding a corresponding one of the plurality of pads so as to expose at least a central portion of the pad, the first plating layer being electrolytically plated in each of the pad openings of the insulating layer, the external terminal being disposed on the first plating layer, the power supply lines being arranged to apply power to the plurality of pads exposed through the pad openings when electrolytic plating is performed; wherein
   in the mother substrate before being separated into the plurality of individual devices, at least one of the plurality of pads provided at a side of one of two neighboring devices of the plurality of individual devices is electrically connected to at least two of the plurality of pads provided at a side of the other of the two neighboring devices via different power supply lines;
   the different power supply lines are separated from each other on a boundary between the two neighboring devices;
   in the component, the plurality of power supply lines are disposed along a divided surface formed when the plurality of components are separated from the mother substrate so as to be separated from one another;
   in the mother substrate before being separated into the plurality of individual devices, the insulating layer includes a boundary opening extending along the boundary between the two neighboring devices;
   a second plating layer is disposed on the plurality of power supply lines exposed through the boundary opening by the electrolytic plating; and
   the second plating layer is arranged along a divided surface formed when the plurality of individual devices are separated from the mother substrate.

2. The electronic component according to claim 1, further comprising a pad upper layer located between the first plating layer in the pad openings and the plurality of pads, wherein the plurality of power supply lines are electrically connected to the plurality of pads via the pad upper layer.

3. The electronic component according to claim 1, wherein at least a portion of the plurality of power supply lines is disposed on the mother substrate.

4. The electronic component according to claim 1, wherein at least a portion of the plurality of power supply line is disposed on the insulating layer.

5. The electronic component according to claim 1, wherein the insulating layer includes a first insulating layer and a second insulating layer, and at least a portion of the power supply lines is disposed between the first insulating layer and the second insulating layer.

6. The electronic component according to claim 1, wherein, in the mother substrate before being separated into the plurality of individual devices, an angle $\theta$ defined by the plurality of power supply lines and the boundary between the two neighboring devices is greater than or equal to about 20° and is less than or equal to about 90°, and an angle defined by the plurality of power supply lines of the component and the divided surface formed when the plurality of devices are separated from the mother substrate is greater than or equal to about 20° and is less than or equal to about 90°.

7. The electronic component according to claim 1, wherein each of the plurality of individual devices is a boundary elastic wave device.

8. The electronic component according to claim 1, wherein each of the plurality of individual devices is a surface acoustic wave device.

9. A method for manufacturing an electronic component comprising:
   a first step of forming a mother substrate including a substrate, a conductive layer formed on the mother substrate and including electrodes and pads of a plurality of devices, an insulating layer formed on a surface of the substrate so as to cover a portion of the conductive layer and including pad openings each surrounding a corresponding one of the pads so as to expose at least a central portion of the pad, and a power supply line connecting the pads in the conductive layer;
   a second step of forming a plating layer in the pad openings of the insulating layer by electrolytic plating while applying power to the power supply line of the mother substrate and forming an external terminal on the plating layer; and
   a third step of cutting the mother substrate including the plating layer and the external terminal formed thereon and separating the mother substrate into individual components each defining one of the plurality of devices; wherein
   the power supply line of the mother substrate formed in the first step perpendicularly, substantially perpendicularly, or diagonally crosses a boundary between two neighboring devices of the plurality of devices and connects the pads in the conductive layers of the two neighboring devices;
   the power supply line is formed on only portions of the boundary surrounding the two neighboring devices in which the power supply line crosses the boundary perpendicularly, substantially perpendicularly, or diagonally; and
   in the component separated from the mother substrate in the third step that defines one of the plurality of devices, divided surfaces of the plurality of power supply lines are formed so as to be separated from one another.

10. The method for manufacturing an electronic component according to claim 9, wherein, in the first step, the insulating layer of the mother substrate is formed so as to be separated from the boundary between the two neighboring devices and includes a boundary opening along the boundary.

11. The method for manufacturing an electronic component according to claim 9, wherein the first step includes a first sub-step of forming the conductive layer on the surface of the substrate using a first electrode layer, a second sub-step of forming the power supply line on the surface of the substrate using a second electrode layer and forming a pad upper layer on the pads of the conductive layer, and a third sub-step of forming the insulating layer so that the pad upper layer is exposed through the pad opening of the insulating layer, and in the second step, the plating layer is formed on the pad upper layer.

12. The method for manufacturing an electronic component according to claim 9, wherein the first step includes a first sub-step of forming the conductive layer on the surface of the substrate using a first electrode layer, a second sub-step of forming, on the surface of the substrate, the insulating layer that partially covers the conductive layer, and a third sub-step of forming the power supply line using a third electrode layer and forming a pad upper layer on the pads of the conductive layer that is exposed through the pad opening of the insulating layer, and in the second step, the plating layer is formed on the pad upper layer.

13. The method for manufacturing an electronic component according to claim 9, wherein, in the first step, the mother substrate is formed so that at least two of the plurality of power supply lines are connected to one of the pads.

14. The method for manufacturing an electronic component according to claim 9, wherein each of the plurality of devices is a surface acoustic wave device.

15. The method for manufacturing an electronic component according to claim 9, wherein each of the plurality of devices is a boundary elastic wave device.

* * * * *